(12) United States Patent
Simsek-Ege et al.

(10) Patent No.: US 11,996,377 B2
(45) Date of Patent: May 28, 2024

(54) MICROELECTRONIC DEVICES AND ELECTRONIC SYSTEMS

(71) Applicant: Micron Technology, Inc., Boise, ID (US)

(72) Inventors: Fatma Arzum Simsek-Ege, Boise, ID (US); Kunal R. Parekh, Boise, ID (US); Beau D. Barry, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 147 days.

(21) Appl. No.: 17/364,335

(22) Filed: Jun. 30, 2021

(65) Prior Publication Data
US 2023/0005854 A1    Jan. 5, 2023

(51) Int. Cl.
*H01L 25/065* (2023.01)
*G11C 11/408* (2006.01)
(Continued)

(52) U.S. Cl.
CPC .......... *H01L 24/08* (2013.01); *G11C 11/4085* (2013.01); *G11C 11/4091* (2013.01);
(Continued)

(58) Field of Classification Search
CPC ..... H01L 24/08; H01L 25/0657; H01L 25/18; H01L 2224/08145; H01L 2224/80896;
(Continued)

(56) References Cited

U.S. PATENT DOCUMENTS

| 5,953,630 A | 9/1999 | Maeda et al. |
| 8,067,286 B2 | 11/2011 | Parekh et al. |

(Continued)

FOREIGN PATENT DOCUMENTS

| CN | 112614853 A | 4/2021 |
| CN | 112802855 A | 5/2021 |

(Continued)

OTHER PUBLICATIONS

Simsek-Ege et al., U.S. Appl. No. 17/364,377 (Year: 2021).
Simsek-Ege et al., U.S. Appl. No. 17/364,476 (Year: 2021).

*Primary Examiner* — Thanh Y. Tran
(74) *Attorney, Agent, or Firm* — TraskBritt

(57) ABSTRACT

A method of forming a microelectronic device comprises forming a first microelectronic device structure comprising a first semiconductor structure, control logic circuitry including transistors at least partially overlying the first semiconductor structure, and a first isolation material covering the first semiconductor structure and the control logic circuitry. A second microelectronic device structure comprising a second semiconductor structure and a second isolation material over the second semiconductor structure is formed. The second isolation material of the second microelectronic device structure is bonded to the first isolation material of the first microelectronic device structure to attach the second microelectronic device structure to the first microelectronic device structure. Memory cells comprising portions of the second semiconductor structure are formed after attaching the second microelectronic device structure to the first microelectronic device structure. Microelectronic devices, electronic systems, and additional methods are also described.

9 Claims, 22 Drawing Sheets

(51) Int. Cl.
  *G11C 11/4091* (2006.01)
  *H01L 23/00* (2006.01)
  *H01L 25/00* (2006.01)
  *H01L 25/18* (2023.01)

(52) U.S. Cl.
  CPC .......... *H01L 24/80* (2013.01); *H01L 25/0657* (2013.01); *H01L 25/18* (2013.01); *H01L 25/50* (2013.01); *H01L 2224/08145* (2013.01); *H01L 2224/80896* (2013.01); *H01L 2924/1431* (2013.01); *H01L 2924/1436* (2013.01)

(58) Field of Classification Search
  CPC ..... H01L 2924/1431; H01L 2924/1436; H01L 21/8221; H10B 12/50
  See application file for complete search history.

(56) References Cited

U.S. PATENT DOCUMENTS

| | | | |
|---|---|---|---|
| 8,153,499 | B2 | 4/2012 | Or-Bach et al. |
| 8,184,471 | B2 | 5/2012 | Woo et al. |
| 8,546,188 | B2 | 10/2013 | Liu et al. |
| 8,716,116 | B2 | 5/2014 | Parekh et al. |
| 9,543,433 | B2 | 1/2017 | Anathan et al. |
| 10,510,738 | B2 | 12/2019 | Kim et al. |
| 11,114,335 | B1 | 9/2021 | Lu |
| 11,557,572 | B2 | 1/2023 | Huang |
| 11,562,985 | B2 | 1/2023 | Liu et al. |
| 2002/0127846 | A1 | 9/2002 | Burrell et al. |
| 2009/0108318 | A1 | 4/2009 | Yoon et al. |
| 2009/0168482 | A1 | 7/2009 | Park et al. |
| 2010/0155932 | A1 | 6/2010 | Gambino et al. |
| 2010/0230724 | A1 | 9/2010 | Sinha et al. |
| 2014/0117420 | A1 | 5/2014 | Chen et al. |
| 2016/0260756 | A1 | 9/2016 | Yamagishi |
| 2019/0043836 | A1 | 2/2019 | Fastow et al. |
| 2019/0074277 | A1 | 3/2019 | Ramaswamy |
| 2019/0103302 | A1 | 4/2019 | Yoon |
| 2019/0104260 | A1 | 4/2019 | Izuhara |
| 2019/0164914 | A1 | 5/2019 | Hu et al. |
| 2019/0214560 | A1 | 7/2019 | Brightsky |
| 2019/0244933 | A1 | 8/2019 | Or-Bach et al. |
| 2020/0066730 | A1 | 2/2020 | Guo et al. |
| 2020/0083229 | A1 | 3/2020 | Kim et al. |
| 2020/0111793 | A1 | 4/2020 | Kim et al. |
| 2020/0203272 | A1 | 6/2020 | Doebler et al. |
| 2020/0258876 | A1 | 8/2020 | Hosoda et al. |
| 2020/0286875 | A1 | 9/2020 | Nishida et al. |
| 2020/0328186 | A1 | 10/2020 | Liu |
| 2020/0350014 | A1 | 11/2020 | Liu |
| 2020/0395328 | A1 | 12/2020 | Fastow et al. |
| 2020/0411524 | A1 | 12/2020 | Arslan et al. |
| 2021/0036015 | A1 | 2/2021 | Lim et al. |
| 2021/0043606 | A1 | 2/2021 | Bowers et al. |
| 2021/0118887 | A1 | 4/2021 | Kuo |
| 2021/0118890 | A1 | 4/2021 | Kim et al. |
| 2021/0143115 | A1 | 5/2021 | Wu et al. |
| 2021/0159216 | A1 | 5/2021 | Wu et al. |
| 2021/0183996 | A1 | 6/2021 | Lee et al. |
| 2021/0217716 | A1 | 7/2021 | Wu et al. |
| 2021/0257266 | A1 | 8/2021 | Oh |
| 2021/0265295 | A1 | 8/2021 | Liu et al. |
| 2021/0296284 | A1 | 9/2021 | Sharangpani et al. |
| 2021/0383874 | A1 | 12/2021 | Oh et al. |
| 2021/0398967 | A1 | 12/2021 | Parekh |
| 2021/0407980 | A1 | 12/2021 | Young et al. |
| 2022/0005820 | A1 | 1/2022 | Kim et al. |
| 2022/0052010 | A1 | 2/2022 | Goda et al. |
| 2022/0077090 | A1 | 3/2022 | Setta |
| 2022/0077129 | A1 | 3/2022 | Sung et al. |
| 2022/0085048 | A1 | 3/2022 | Lee et al. |
| 2022/0123006 | A1 | 4/2022 | Ahn et al. |
| 2022/0216239 | A1 | 7/2022 | Yoo et al. |
| 2022/0302150 | A1 | 9/2022 | Zhang et al. |
| 2022/0328493 | A1 | 10/2022 | Wang et al. |
| 2022/0367505 | A1 | 11/2022 | Chen et al. |
| 2022/0399309 | A1 | 12/2022 | Simsek-Ege |
| 2023/0005855 | A1* | 1/2023 | Simsek-Ege ............ H01L 25/18 |
| 2023/0005902 | A1* | 1/2023 | Simsek-Ege ......... H10B 12/485 |
| 2023/0005903 | A1* | 1/2023 | Simsek-Ege ........... H10B 12/33 |
| 2023/0015040 | A1 | 1/2023 | Or-Bach et al. |

FOREIGN PATENT DOCUMENTS

| | | |
|---|---|---|
| CN | 113053435 A | 6/2021 |
| TW | 201523855 A | 6/2015 |
| TW | 202125778 A | 7/2021 |
| WO | 2008063251 A2 | 5/2008 |
| WO | 2020/211272 A1 | 10/2020 |

* cited by examiner

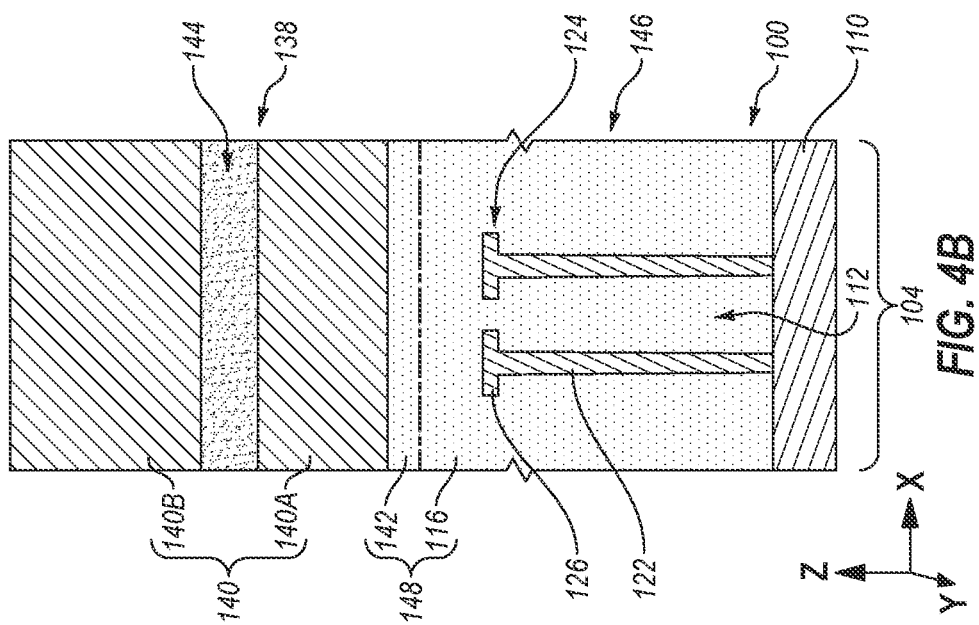
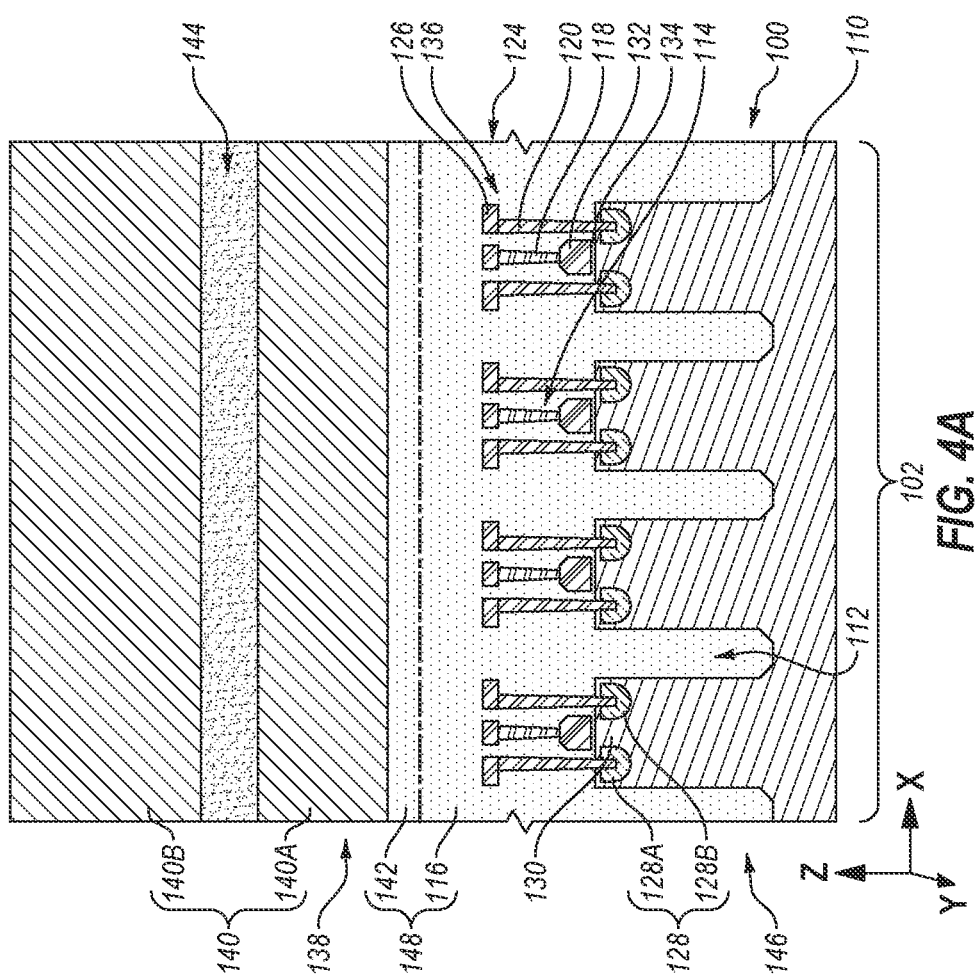
FIG. 4A
FIG. 4B

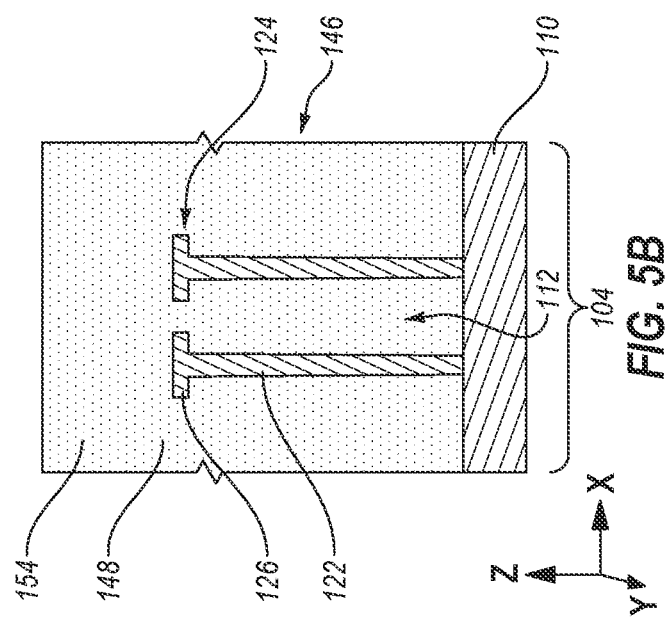
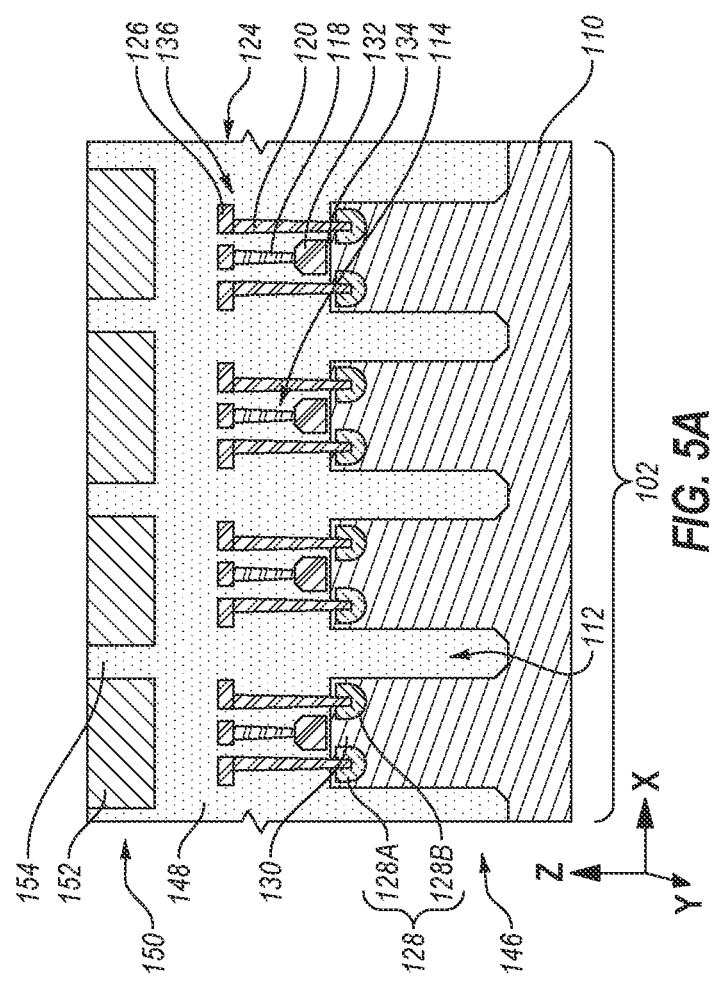
FIG. 5A
FIG. 5B

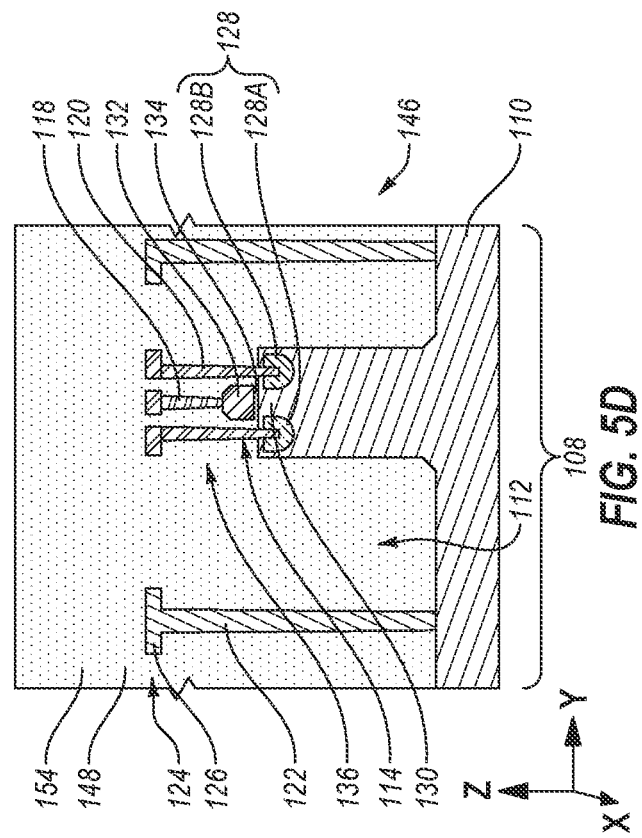
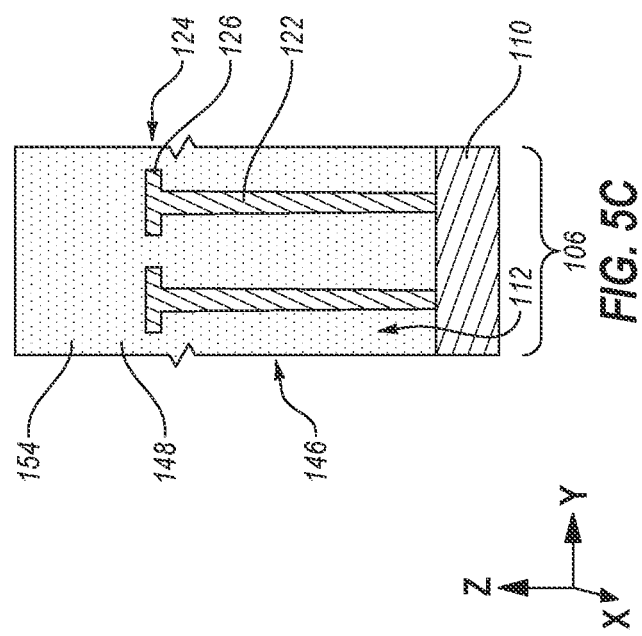

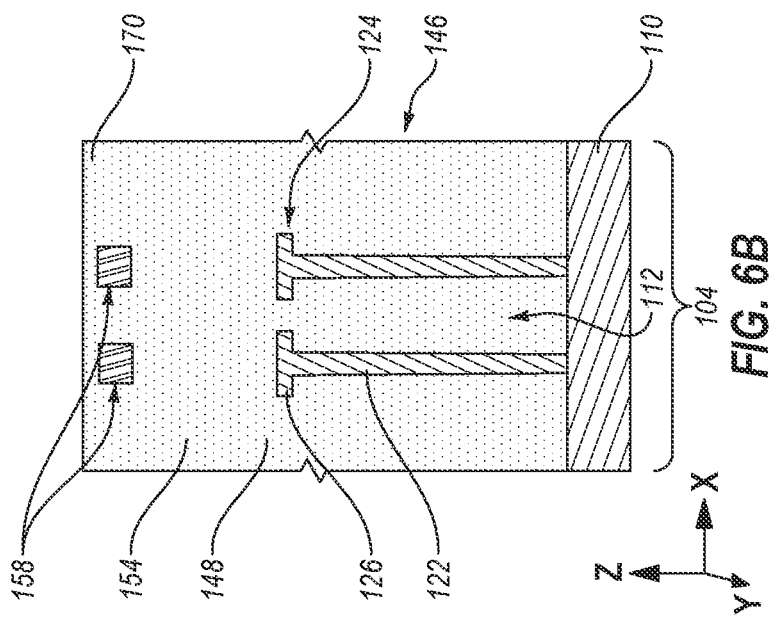
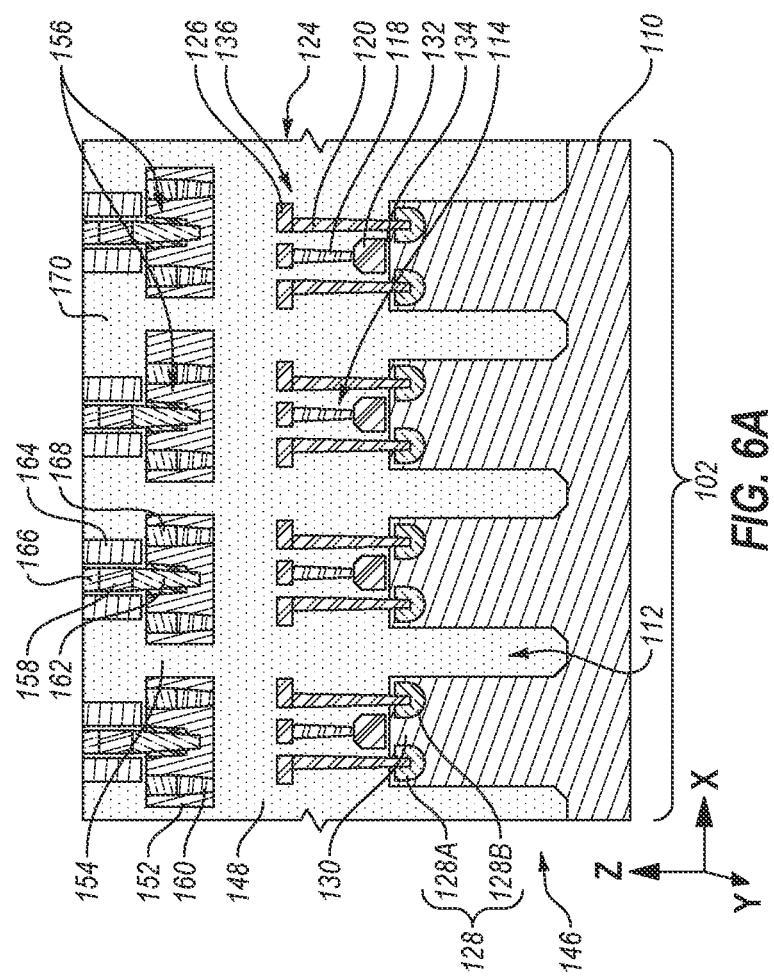
FIG. 6A
FIG. 6B

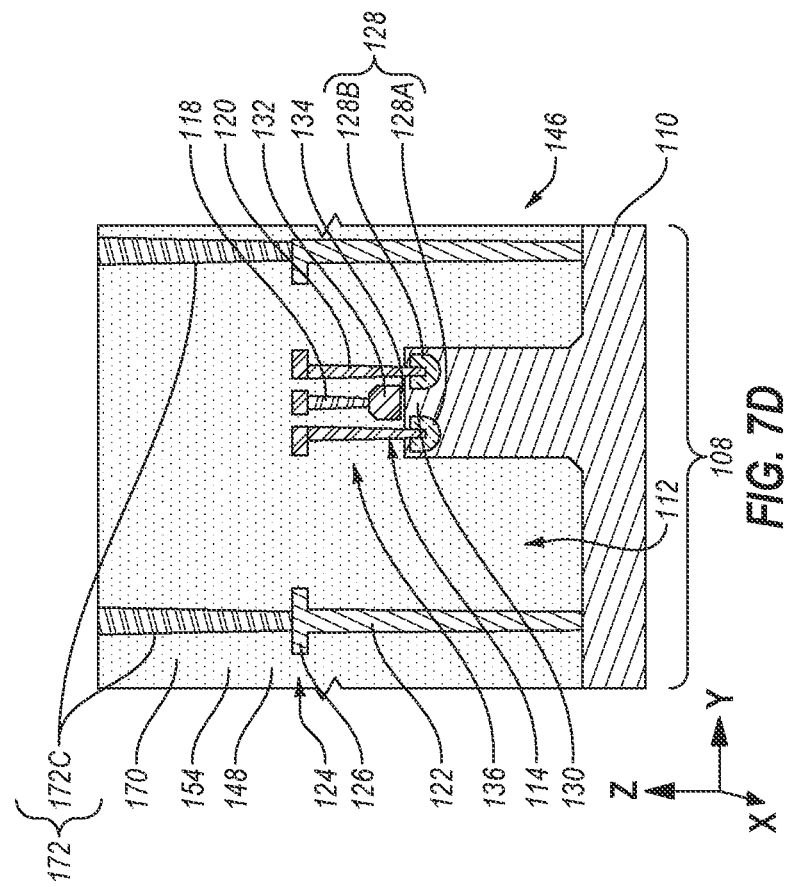
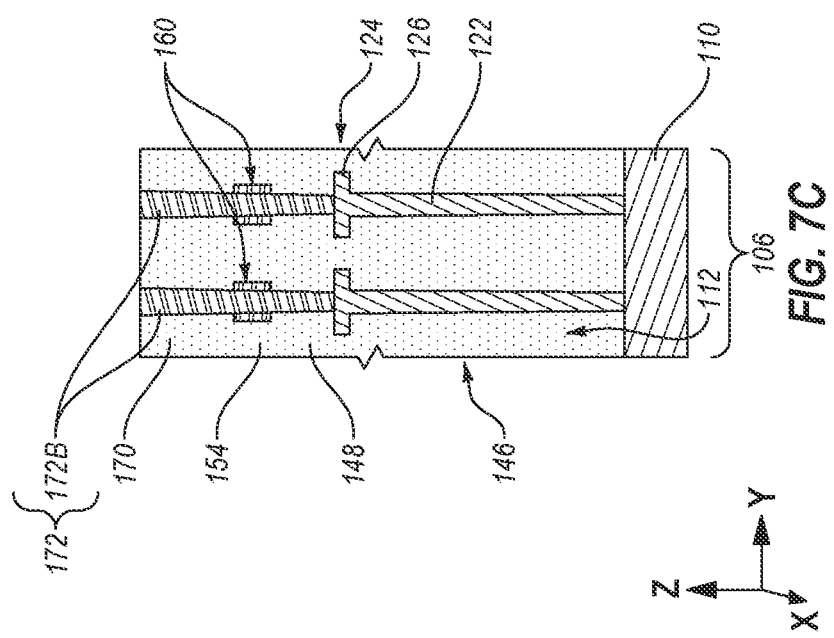
FIG. 7D
FIG. 7C

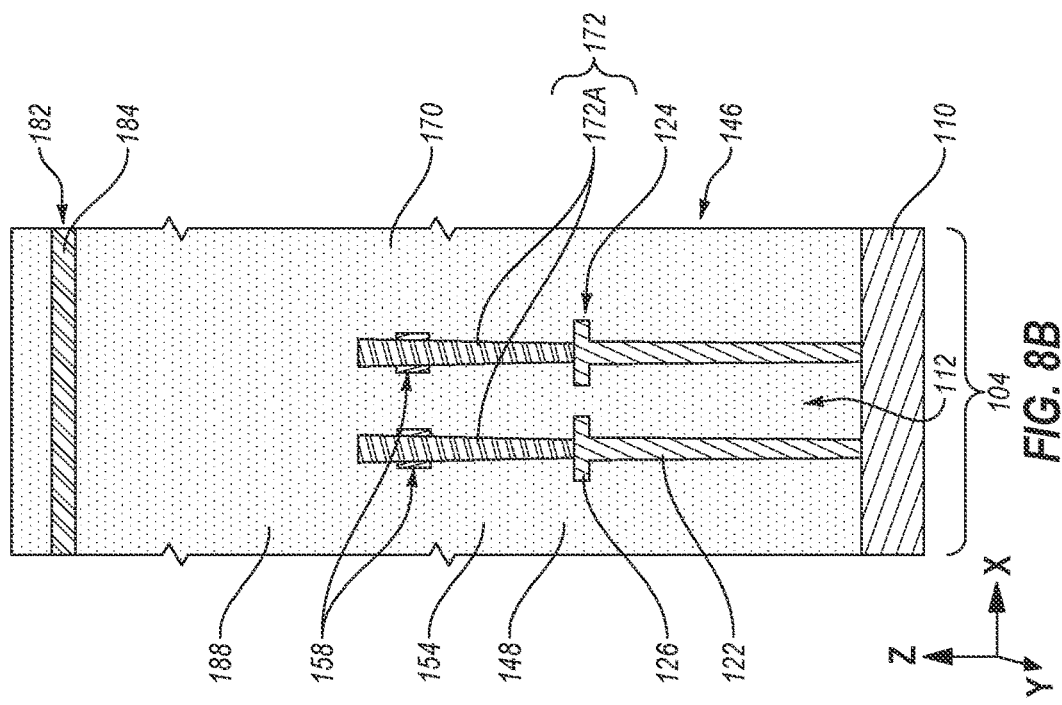
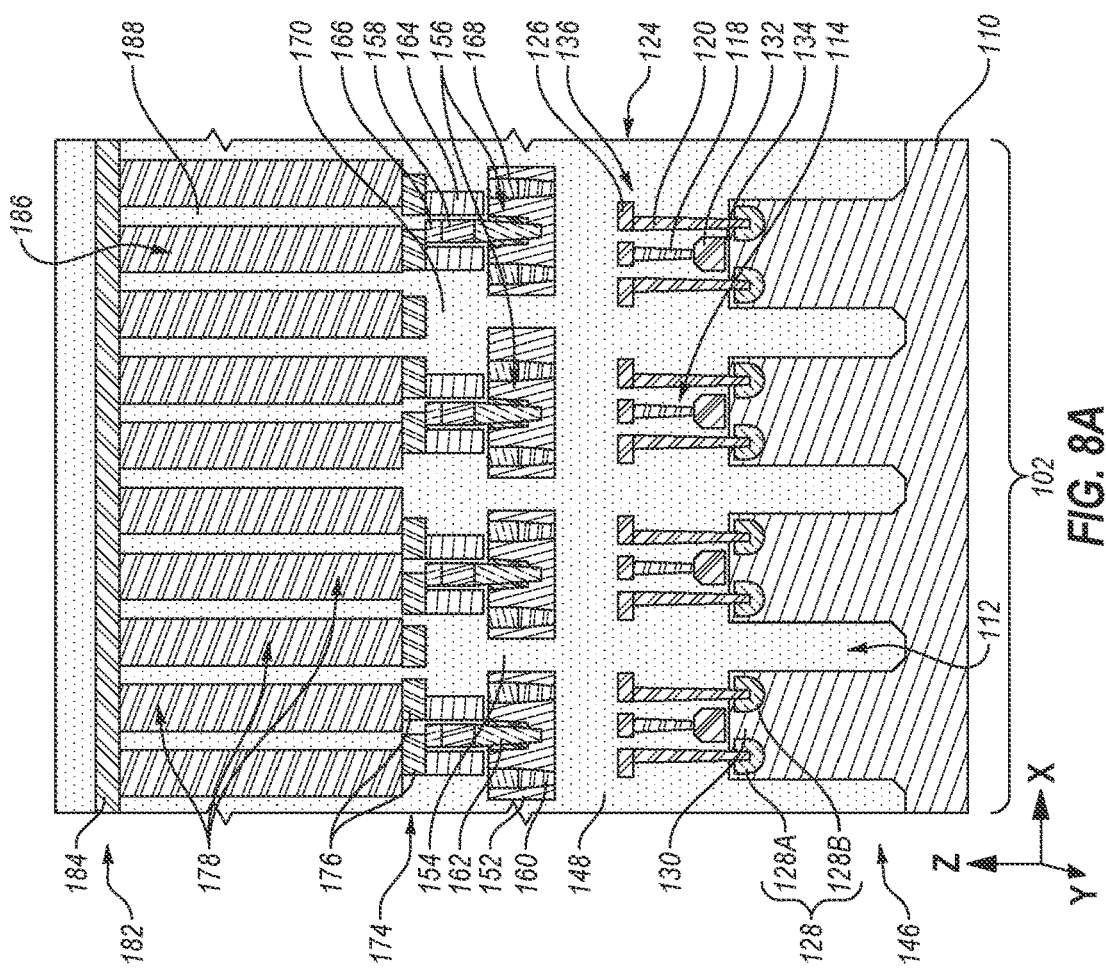
FIG. 8A
FIG. 8B

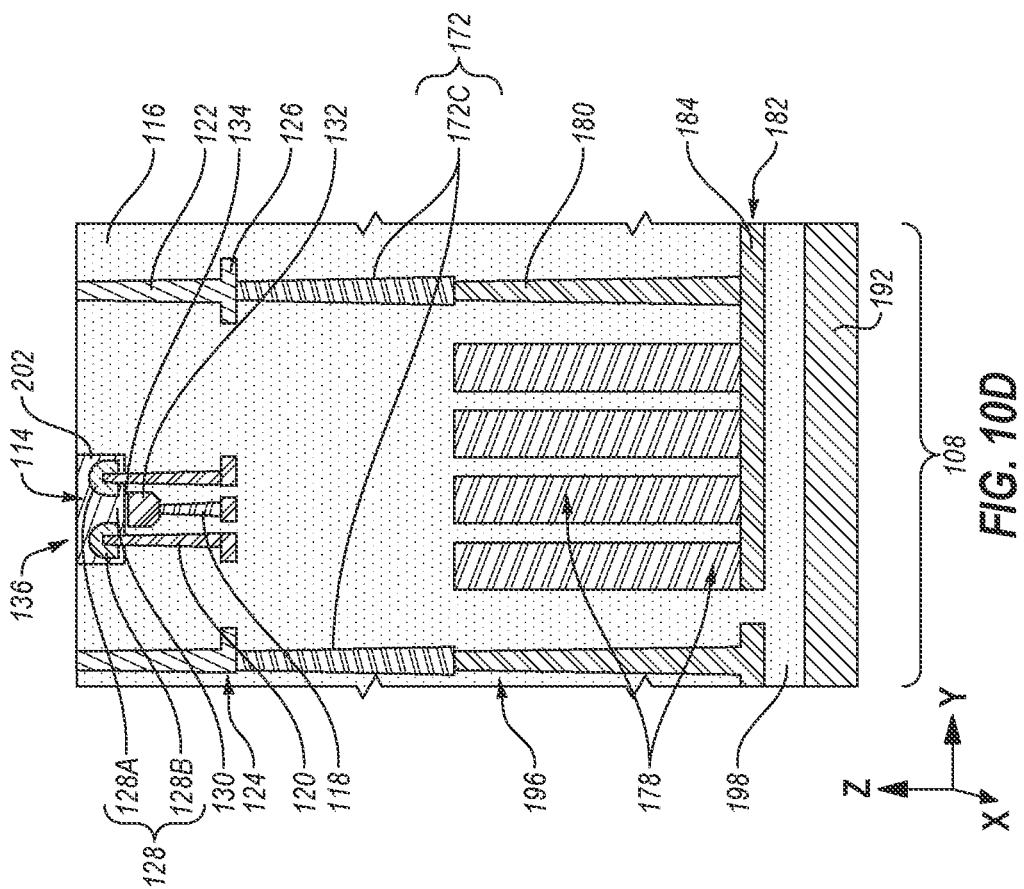
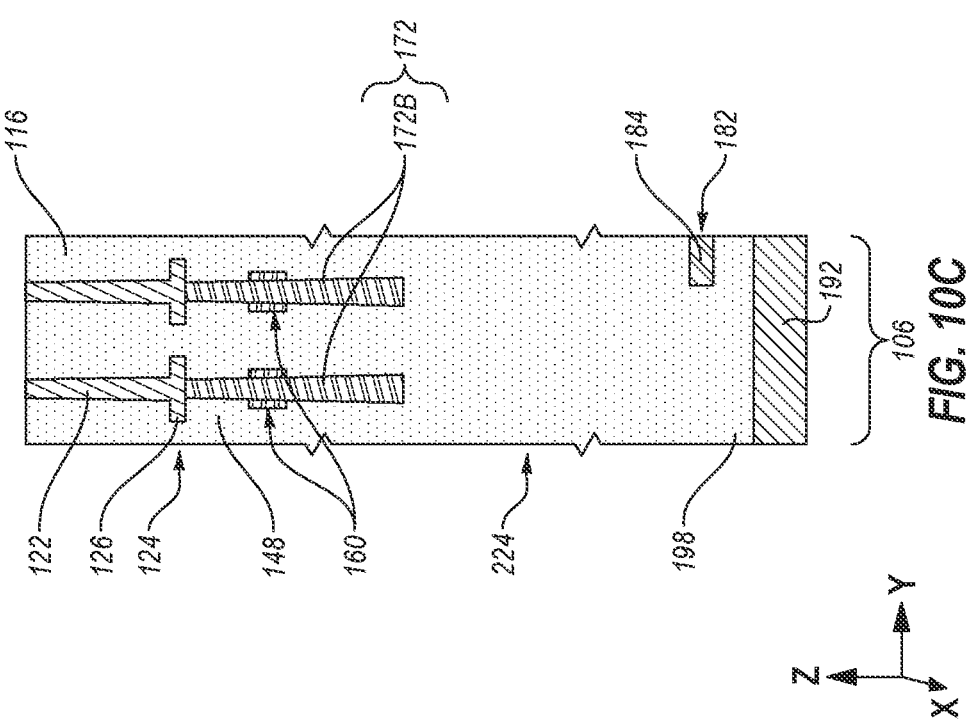
FIG. 10C
FIG. 10D

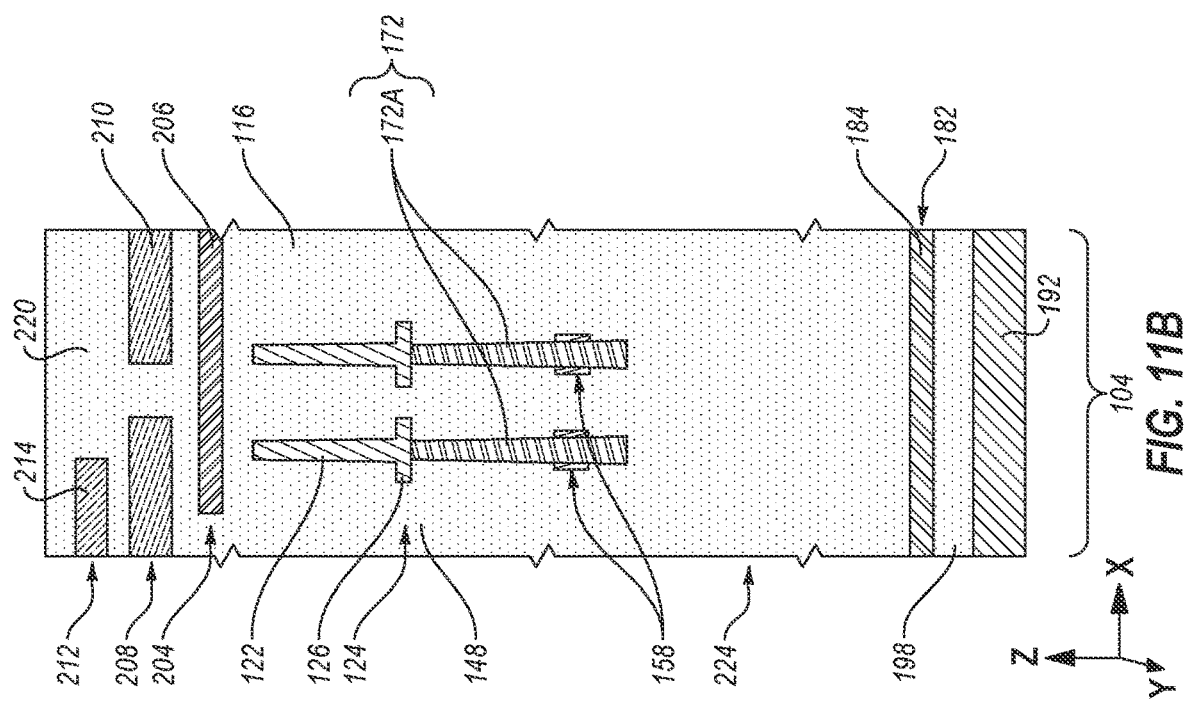
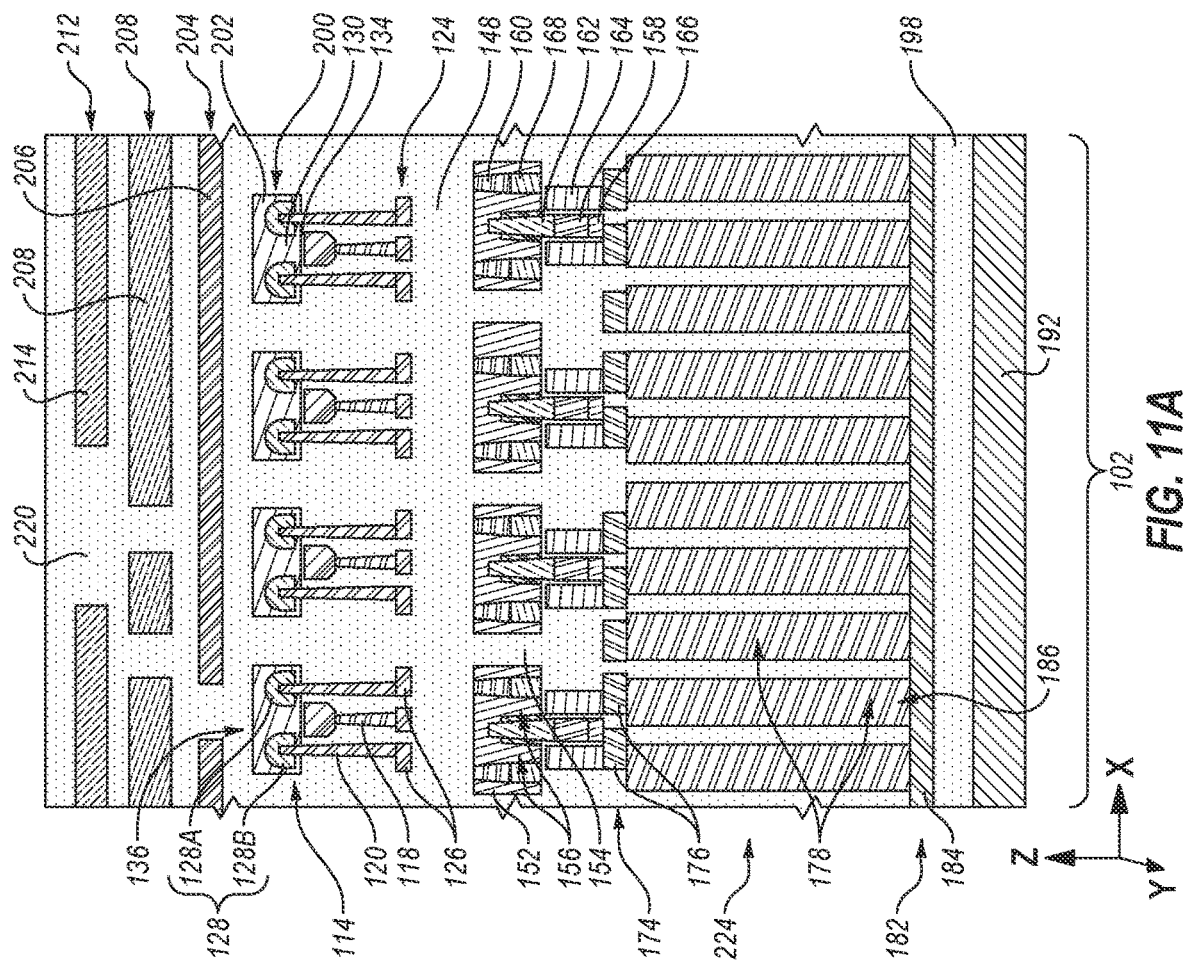
FIG. 11B
FIG. 11A

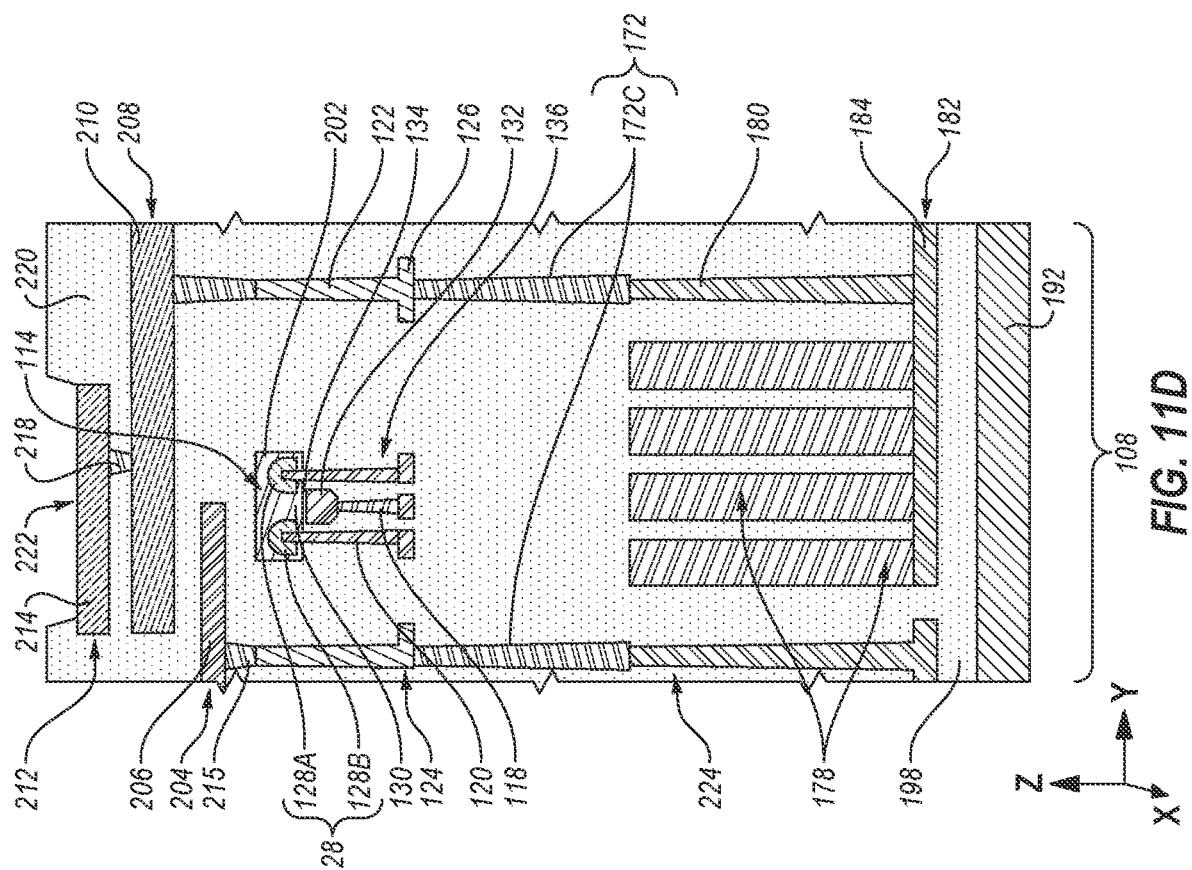
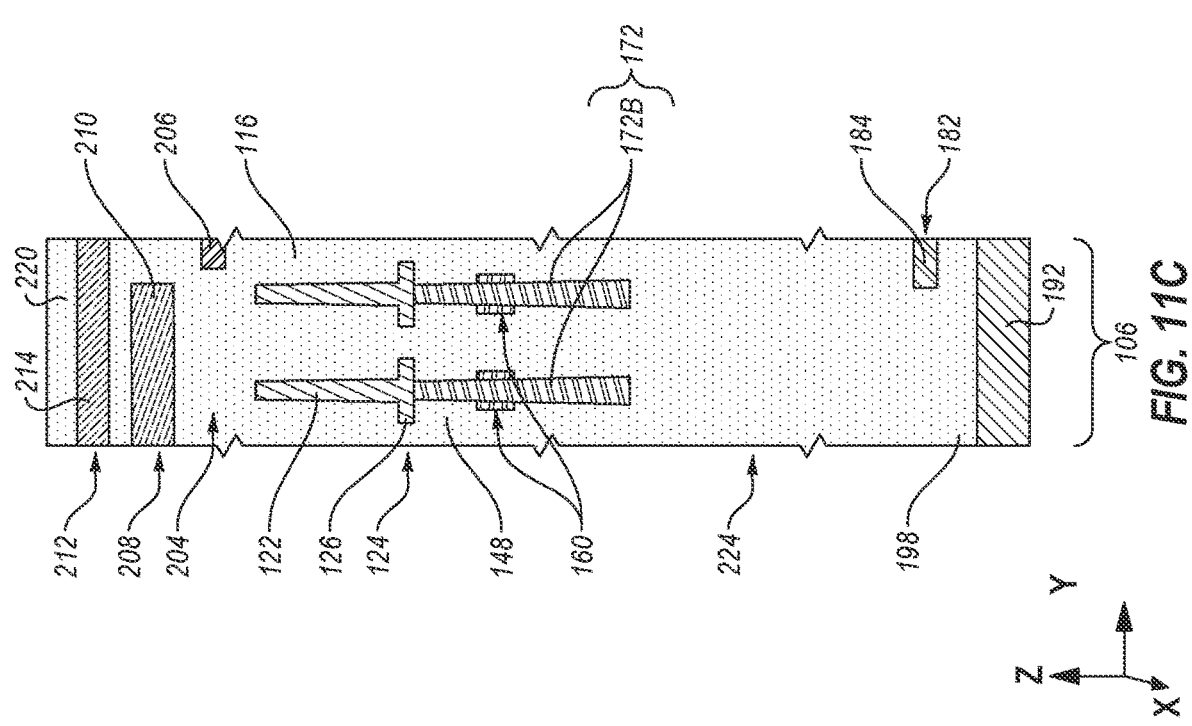

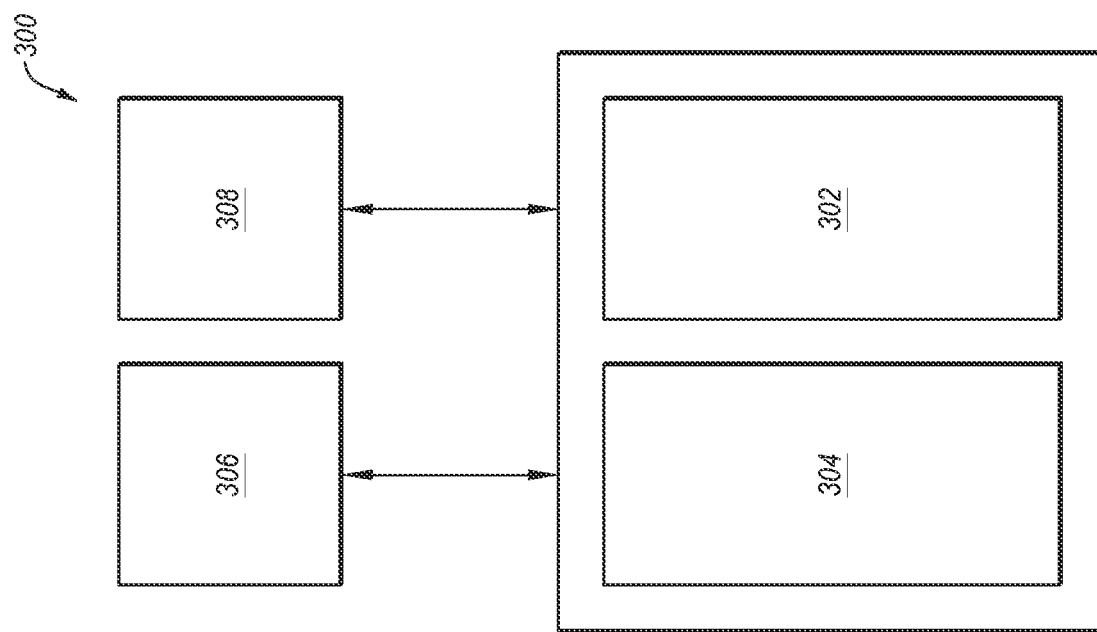

MICROELECTRONIC DEVICES AND ELECTRONIC SYSTEMS

CROSS-REFERENCE TO RELATED APPLICATIONS

This application is related to U.S. patent application Ser. No. 17/364,281, filed Jun. 30, 2021, listing Fatma Arzum Simsek-Ege, Kunal R. Parekh, Terrence B. McDaniel, and Beau D. Barry as inventors, for "METHODS OF FORMING MICROELECTRONIC DEVICES, AND RELATED MICROELECTRONIC DEVICES AND ELECTRONIC SYSTEMS." This application is also related to U.S. patent application Ser. No. 17/364,377, filed Jun. 30, 2021, listing Fatma Arzum Simsek-Ege and Kunal R. Parekh as inventors, for "METHODS OF FORMING MICROELECTRONIC DEVICES, AND RELATED MICROELECTRONIC DEVICES AND ELECTRONIC SYSTEMS." This application is also related to U.S. patent application Ser. No. 17/364,429, filed Jun. 30, 2021, listing Fatma Arzum Simsek-Ege as inventor, for "METHODS OF FORMING MICROELECTRONIC DEVICES, AND RELATED MICROELECTRONIC DEVICES AND ELECTRONIC SYSTEMS." This application is also related to U.S. patent application Ser. No. 17/364,476, filed Jun. 30, 2021, listing Fatma Arzum Simsek-Ege and Kunal R. Parekh as inventors, for "METHODS OF FORMING MICROELECTRONIC DEVICES, AND RELATED MICROELECTRONIC DEVICES AND ELECTRONIC SYSTEMS." This application is also related to U.S. patent application Ser. No. 17/364,379, filed Jun. 30, 2021, listing Fatma Arzum Simsek-Ege as inventor, for "METHODS OF FORMING MICROELECTRONIC DEVICES, AND RELATED MICROELECTRONIC DEVICES AND ELECTRONIC SYSTEMS." The disclosure of each of the foregoing documents is hereby incorporated herein in its entirety by reference.

TECHNICAL FIELD

The disclosure, in various embodiments, relates generally to the field of microelectronic device design and fabrication. More specifically, the disclosure relates to methods of forming microelectronic devices and memory devices, and to related microelectronic devices, memory devices, and electronic systems.

BACKGROUND

Microelectronic device designers often desire to increase the level of integration or density of features within a microelectronic device by reducing the dimensions of the individual features and by reducing the separation distance between neighboring features. In addition, microelectronic device designers often desire to design architectures that are not only compact, but offer performance advantages, as well as simplified, easier and less expensive to fabricate designs.

One example of a microelectronic device is a memory device. Memory devices are generally provided as internal integrated circuits in computers or other electronic devices. There are many types of memory devices including, but not limited to, volatile memory devices. One type of volatile memory device is a dynamic random access memory (DRAM) device. A DRAM device may include a memory array including DRAM cells arranged rows extending in a first horizontal direction and columns extending in a second horizontal direction. In one design configuration, an individual DRAM cell includes an access device (e.g., a transistor) and a storage node device (e.g., a capacitor) electrically connected to the access device. The DRAM cells of a DRAM device are electrically accessible through digit lines and word lines arranged along the rows and columns of the memory array and in electrical communication with control logic devices within a base control logic structure of the DRAM device.

Control logic devices within a base control logic structure underlying a memory, array of a DRAM device have been used to control operations on the DRAM cells of the DRAM device. Control logic devices of the base control logic structure can be provided in electrical communication with digit lines and word lines coupled to the DRAM cells by way of routing and contact structures. Unfortunately, processing conditions (e.g., temperatures, pressures, materials) for the formation of the memory array over the base control logic structure can limit the configurations and performance of the control logic devices within the base control logic structure. In addition, the quantities, dimensions, and arrangements of the different control logic devices employed within the base control logic structure can also undesirably impede reductions to the size (e.g., horizontal footprint) of a memory device, and/or improvements in the performance (e.g., faster memory cell ON/OFF speed, lower threshold switching voltage requirements, faster data transfer rates, lower power consumption) of the DRAM device.

BRIEF DESCRIPTION OF THE DRAWINGS

FIGS. 4A through 4D are simplified, partial longitudinal cross-sectional views of the array region (FIG. 4A), the digit line exit region (FIG. 4B), the word line exit region (FIG. 4C), and the socket region (FIG. 4D) shown in FIGS. 2A through 2D, respectively, at another processing stage of the method of forming the microelectronic device following the processing stage of FIGS. 1 and 2A through 2D and the processing stage of FIG. 3.

FIGS. 5A through 5D are simplified, partial longitudinal cross-sectional views of the array region (FIG. 5A), the digit line exit region (FIG. 5B), the word line exit region (FIG. 5C), and the socket region (FIG. 5D) shown in FIGS. 2A through 2D, respectively, at another processing stage of the method of forming the microelectronic device following the processing stage of FIGS. 4A through 4D.

FIGS. 6A through 6D are simplified, partial longitudinal cross-sectional views of the array region (FIG. 6A), the digit line exit region (FIG. 6B), the word line exit region (FIG. 6C), and the socket region (FIG. 6D) shown in FIGS. 2A through 2D, respectively, at another processing stage of the method of forming the microelectronic device following the processing stage of FIGS. 5A through 5D.

FIGS. 7A through 7D are simplified, partial longitudinal cross-sectional views of the array region (FIG. 7A), the digit line exit region (FIG. 7B), the word line exit region (FIG. 7C), and the socket region (FIG. 7D) shown in FIGS. 2A through 2D, respectively, at another processing stage of the method of forming the microelectronic device following the processing stage of FIGS. 6A through 6D.

FIGS. 8A through 8D are simplified, partial longitudinal cross-sectional views of the array region (FIG. 8A), the digit line exit region (FIG. 8B), the word line exit region (FIG. 8C), and the socket region (FIG. 8D) shown in FIGS. 2A through 2D, respectively, at another processing stage of the method of forming the microelectronic device following the processing stage of FIGS. 7A through 7D.

Figures 10A, 10B:
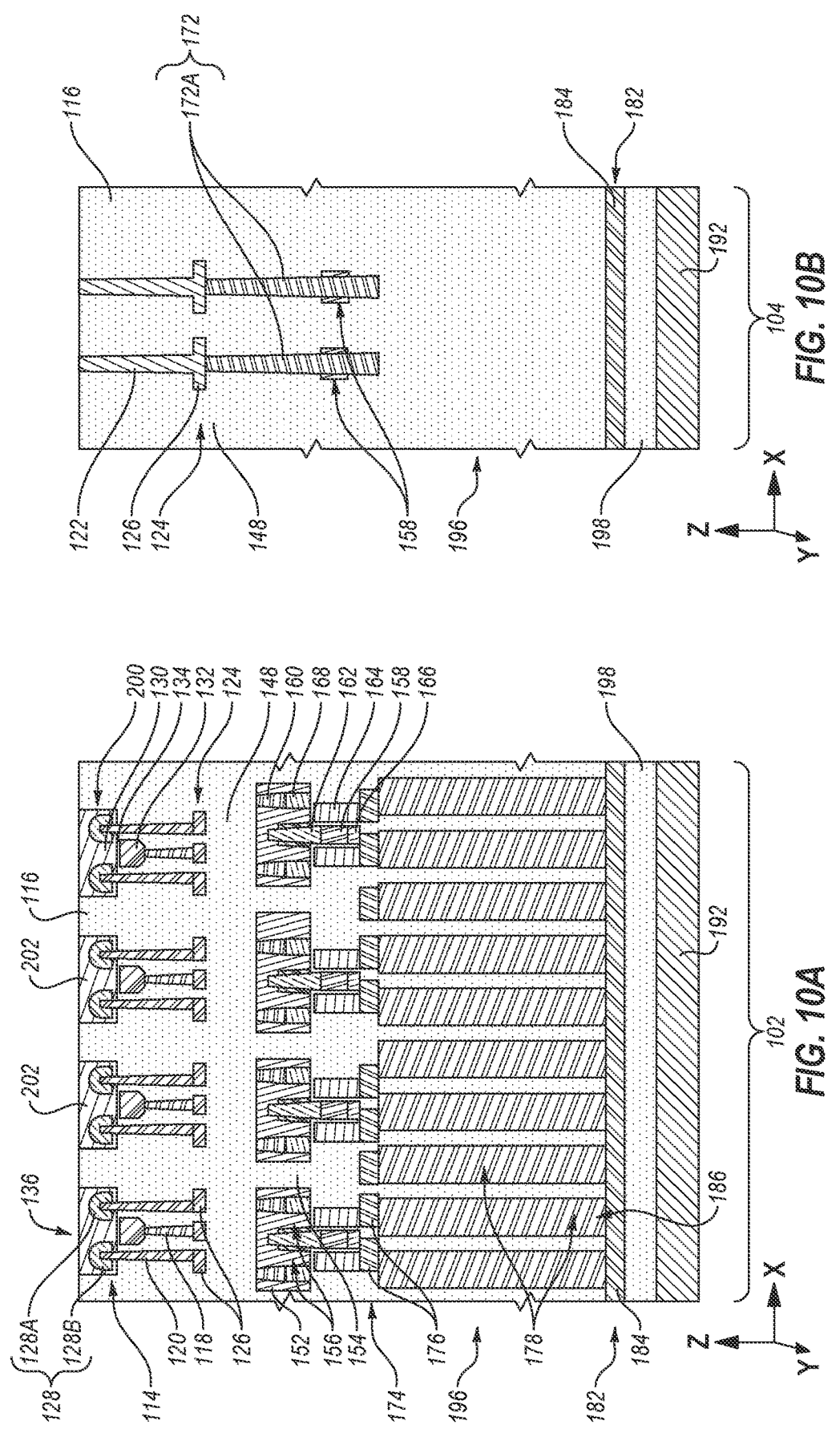

FIGS. 10A through 10D are simplified, partial longitudinal cross-sectional views of the array region (FIG. 10A), the digit line exit region (FIG. 10B), the word line exit region (FIG. 10C), and the socket region (FIG. 10D) shown in FIGS. 2A through 2D, respectively, at another processing stage of the method of forming the microelectronic device following the processing stage of FIGS. 9A through 9D.

FIGS. 11A through 11D are simplified, partial longitudinal cross-sectional views of the array region (FIG. 11A), the digit line exit region (FIG. 11B), the word line exit region (FIG. 11C), and the socket region (FIG. 11D) shown in FIGS. 2A through 2D, respectively, at another processing stage of the method of forming the microelectronic device following the processing stage of FIGS. 10A through 10D.

FIG. 13 is a schematic block diagram of an electronic system, in accordance with an embodiment of the disclosure.

DETAILED DESCRIPTION

Figure 1:
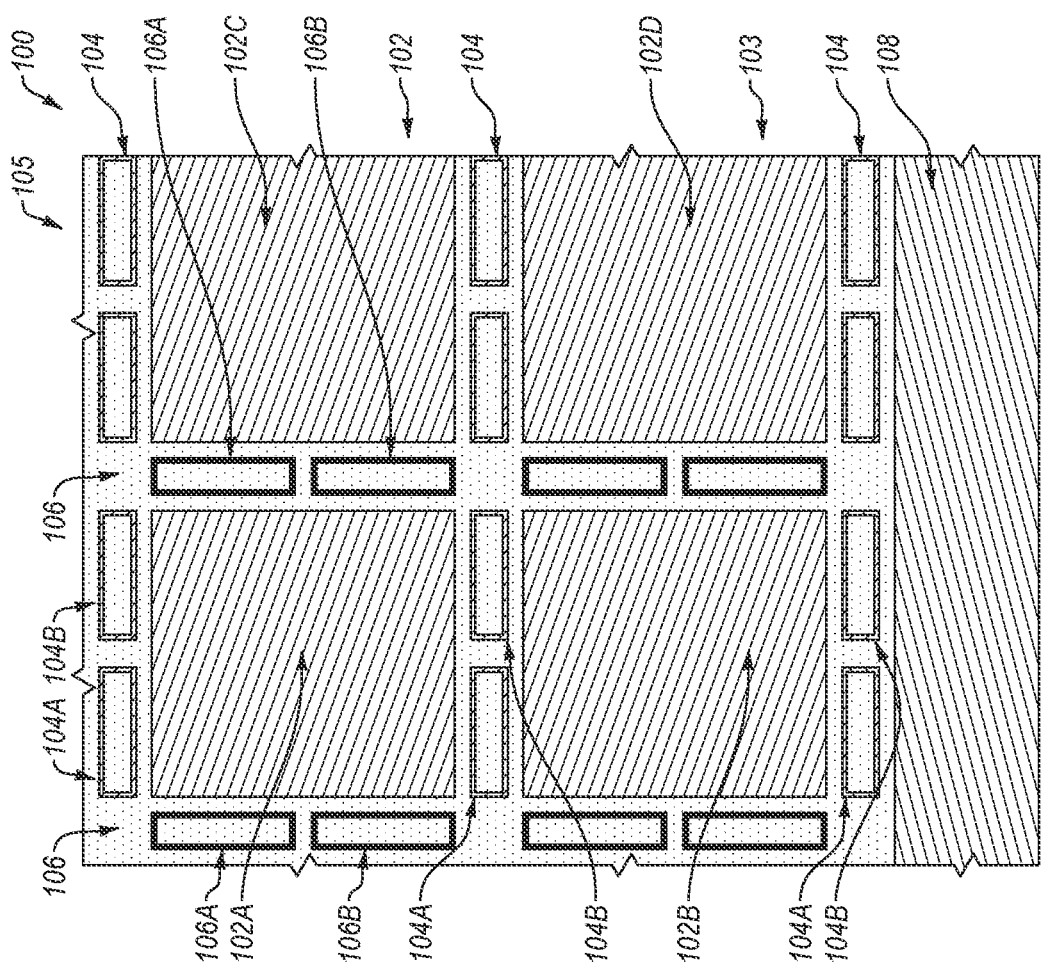
FIG. 1 is a simplified plan view of a first microelectronic device structure at a processing stage of a method of forming a microelectronic device, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes microelectronic devices exhibiting memory functionality, but not necessarily limited to memory functionality. Stated another way, and by way of non-limiting example only, the term "memory device" includes not only conventional memory (e.g., conventional volatile memory; conventional non-volatile memory), but also includes an application specific integrated circuit (ASIC) (e.g., a system on a chip (SoC)), a microelectronic device combining logic and memory, and a graphics processing unit (GPU) incorporating memory.

As used herein, the term "configured" refers to a size, shape, material composition, orientation, and arrangement of one or more of at least one structure and at least one apparatus facilitating operation of one or more of the structure and the apparatus in a pre-determined way.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), at least one dielectric oxycarbide material (e.g., silicon oxycarbide ($SiO_xC_y$)), at least one hydrogenated dielectric oxycarbide material (e.g., hydrogenated silicon oxycarbide ($SiC_xO_yH_z$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xC_y$, $SiC_xO_yH_z$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

Unless the context indicates otherwise, the materials described herein may be formed by any suitable technique including, but not limited to, spin coating, blanket coating, chemical vapor deposition (CVD), plasma enhanced CVD (PECVD), atomic layer deposition (ALD), plasma enhanced ALD (PEALD), physical vapor deposition (PVD) (e.g., sputtering), or epitaxial growth. Depending on the specific material to be formed, the technique for depositing or growing the material may be selected by a person of ordinary skill in the art. In addition, unless the context indicates otherwise, removal of materials described herein may be accomplished by any suitable technique including, but not limited to, etching (e.g., dry etching, wet etching, vapor etching), ion milling, abrasive planarization (e.g., chemical-mechanical planarization (CMP)), or other known methods.

FIGS. 1 through 12 are various views (described in further detail below) illustrating different processing stages of a method of forming a microelectronic device (e.g., a memory device, such as a DRAM device), in accordance with embodiments of the disclosure. With the description provided below, it will be readily apparent to one of ordinary skill in the art that the methods described herein may be used for forming various devices. In other words, the methods of the disclosure may be used whenever it is desired to form a microelectronic device. With the description provided below, it will be readily apparent to one of ordinary skill in the art that the methods and structures described herein may be used to form various devices and electronic systems.

FIG. 1 shows a simplified plan view of a first microelectronic device structure 100 (e.g., a first wafer) at an early processing stage of a method of forming a microelectronic device (e.g., a memory device, such as a DRAM device), in accordance with embodiments of the disclosure. As shown in FIG. 1, the first microelectronic device structure 100 may be formed to include array regions 102, digit line exit regions 104 (also referred to as "digit line contact socket regions") interposed between pairs of the array regions 102 horizontally neighboring one another in a first horizontal direction (e.g., the Y-direction), word line exit regions 106 (also referred to as "word line contact socket regions") interposed between additional pairs of the array regions 102 horizontally neighboring one another in a second horizontal direction (e.g., the X-direction) orthogonal to the first horizontal direction, and one or more socket regions 108 (also referred to as "back end of line (BEOL) contact socket regions") horizontally neighboring some of the array regions 102 in one or more of the first horizontal direction and the second horizontal direction. The array regions 102, the digit line exit regions 104, the word line exit regions 106, and the socket regions 108 are each described in further detail below.

The array regions 102 of the first microelectronic device structure 100 may comprise horizontal areas of the first microelectronic device structure 100 configured and positioned to have arrays of memory cells (e.g., arrays of DRAM cells) subsequently formed within horizontal boundaries thereof, as described in further detail below. In addition, the array regions 102 may also be configured and positioned to have desirable arrangements of control logic devices subsequently formed within horizontal boundaries thereof, as also described in further detail below. The control logic devices to be formed within the horizontal boundaries of the array regions 102 may be formed to be vertically offset (e.g., in the Z-direction) from the memory cells to be formed within the horizontal boundaries of the array regions 102.

The first microelectronic device structure 100 may be formed to include a desired quantity of the array regions 102. For clarity and ease of understanding of the drawings and related description, FIG. 1 depicts the first microelectronic device structure 100 as being formed to include four (4) array regions 102: a first array region 102A, a second array region 102B, a third array region 102C, and a fourth array region 102D. As shown in FIG. 1, the second array region 102B may horizontally neighbor the first array region 102A in the Y-direction, and may horizontally neighbor the fourth array region 102D in the X-direction; the third array region 102C may horizontally neighbor the first array region 102A in the X-direction, and may horizontally neighbor the fourth array region 102D in the Y-direction; and the fourth array region 102D may horizontally neighbor the third array region 102C in the Y-direction, and may horizontally neighboring the second array region 102B in the Y-direction. In additional embodiments, the first microelectronic device structure 100 is formed to include a different number of array regions 102. For example, the first microelectronic device structure 100 may be formed to include greater than four (4) array regions 102, such as greater than or equal to eight (8) array regions 102, greater than or equal to sixteen (16) array regions 102, greater than or equal to thirty-two (32) array regions 102, greater than or equal to sixty-four (64) array regions 102, greater than or equal to one hundred twenty eight (128) array regions 102, greater than or equal to two hundred fifty six (256) array regions 102, greater than or equal to five hundred twelve (512) array regions 102, or greater than or equal to one thousand twenty-four (1024) array regions 102.

In addition, the first microelectronic device structure 100 may be formed to include a desired distribution of the array regions 102. As shown in FIG. 1, in some embodiments, the first microelectronic device structure 100 is formed to include rows 103 of the array regions 102 extending in the X-direction, and columns 105 of the array regions 102 extending in the Y-direction. The rows 103 of the array regions 102 may, for example, include a first row including the first array region 102A and the third array region 102C, and a second row including the second array region 102B and the fourth array region 102D. The columns 105 of the array regions 102 may, for example, include a first column including the first array region 102A and the second array region 102B, and a second column including the third array region 102C and the fourth array region 102D.

With continued reference to FIG. 1, the digit line exit regions 104 of the first microelectronic device structure 100 may comprise horizontal areas of the first microelectronic device structure 100 configured and positioned to have at least some subsequently formed digit lines (e.g., bit lines, data lines) horizontally terminate therein. For an individual digit line exit region 104, at least some subsequently formed digit lines operatively associated with the array regions 102 flanking (e.g., at opposing boundaries in the Y-direction) the digit line exit region 104 may have ends within the horizontal boundaries of the digit line exit region 104. In addition, the digit line exit regions 104 may also be configured and positioned to include contact structures and routing structures with the horizontal boundaries thereof that are operatively associated with at least some of the subsequently formed digit lines. As described in further detail below, some of the contact structures to be formed within the digit line exit regions 104 may couple the subsequently formed digit lines to control logic circuitry of control logic devices (e.g., sense amplifier (SA) devices) to subsequently be formed within the array regions 102. As shown in FIG. 1, in some embodiments, the digit line exit regions 104 horizontally extend in the X-direction, and are horizontally interposed between horizontally neighboring rows of the array regions 102 in the Y-direction. The digit line exit regions 104 may, for example, horizontally alternate with the rows of the array regions 102 in the Y-direction.

An individual digit line exit region 104 may be divided into multiple subregions. For example, as shown in FIG. 1, an individual digit line exit region 104 may include first digit line exit subregions 104A and second digit line exit subregions 104B. In some embodiments, the first digit line exit subregions 104A horizontally alternate with the second digit line exit subregions 104B in the X-direction. A pair (e.g., two (2)) of horizontally neighboring array regions 102 within an individual column of the array regions 102 may include one (1) of the first digit line exit subregions 104A and one (1) of the second digit line exit subregions 104B positioned horizontally therebetween in the Y-direction. By way of non-limiting example, the first array region 102A and the second array region 102B of a first column of the array regions 102 may include one (1) of the first digit line exit subregions 104A and one (1) of the second digit line exit subregions 104B positioned therebetween in the Y-direction. The one (1) of the first digit line exit subregions 104A and the one (1) of the second digit line exit subregions 104B may be at least partially (e.g., substantially) confined with horizontal boundaries in the X-direction of the first array region 102A and the second array region 102B.

As described in further detail below, an individual first digit line exit subregion 104A may be configured and positioned to facilitate electrical connections between a group of digit lines (e.g., odd digit lines or even digit lines) and a group of control logic devices (e.g., odd SA devices or even SA devices) operatively associated with a portion (e.g., a half portion in the X-direction) of one (1) array region 102 (e.g., the first array region 102A) of a pair of horizontally neighboring array regions 102, and to also facilitate electrical connections between a group of additional digit lines (e.g., additional odd digit lines or additional even digit lines) and a group of additional control logic devices (e.g., additional odd SA devices or additional even SA devices) operatively associated with a corresponding portion (e.g., a corresponding half portion in the X-direction) of an additional array region 102 (e.g., the second array region 102B) of the pair of horizontally neighboring array regions 102. In addition, as also described in further detail below, an individual second digit line exit subregion 104B may be configured and positioned to facilitate electrical connections between a group of further digit lines and a group of further control logic devices operatively associated with another portion (e.g., another half portion in the X-direction) of the one (1) array region 102 (e.g., the first array region 102A), and to also facilitate electrical connections between a group of yet further digit lines and a group of yet further control logic devices operatively associated with a corresponding another portion (e.g., a corresponding another half portion in the X-direction) of the additional array region 102 (e.g., the second array region 102B).

Still referring to FIG. 1, the word line exit regions 106 of the first microelectronic device structure 100 may comprise horizontal areas of the first microelectronic device structure 100 configured and positioned to have at least some subsequently formed word lines (e.g., access lines) horizontally terminate therein. For an individual word line exit region 106, at least some subsequently formed word lines operatively associated with the array regions 102 flanking (e.g., at opposing boundaries in the X-direction) the word line exit region 106 may have ends within the horizontal boundaries of the word line exit region 106. In addition, the word line exit regions 106 may also be configured and positioned to include contact structures and routing structures within the horizontal boundaries thereof that are operatively associated with the subsequently formed word lines. As described in further detail below, some of the contact structures to be formed within the word line exit regions 106 may couple the subsequently formed word lines to control logic circuitry of additional control logic devices (e.g., sub-word line driver (SWD) devices) to subsequently be formed within the array regions 102. As shown in FIG. 1, in some embodiments, the word line exit regions 106 horizontally extend in the Y-direction, and are horizontally interposed between horizontally neighboring columns of the array regions 102 in the X-direction. The word line exit regions 106 may, for example, horizontally alternate with the columns of the array regions 102 in the X-direction.

An individual word line exit region 106 may be divided into multiple subregions. For example, as shown in FIG. 1, an individual word line exit region 106 may include first word line exit subregions 106A and second word line exit subregions 106B. In some embodiments, the first word line exit subregions 106A horizontally alternate with the second word line exit subregions 106B in the Y-direction. A pair (e.g., two (2)) of horizontally neighboring array regions 102 within an individual row of the array regions 102 may include one (1) of the first word line exit subregions 106A and one (1) of the second word line exit subregions 106B positioned horizontally therebetween in the X-direction. By way of non-limiting example, the first array region 102A and the third array region 102C of a first row of the array regions 102 may include one (1) of the first word line exit subregions 106A and one (1) of the second word line exit subregions 106B positioned therebetween in the X-direction. The one (1) of the first word line exit subregions 106A and the one (1) of the second word line exit subregions 106B may be at least partially (e.g., substantially) confined with horizontal boundaries in the Y-direction of the first array region 102A and the third array region 102C.

As described in further detail below, an individual first word line exit subregion 106A may be configured and positioned to facilitate electrical connections between a group of word lines (e.g., odd word lines or even word lines) and a group of control logic devices (e.g., odd SWD devices or even SWD devices) operatively associated with a portion (e.g., a half portion in the Y-direction) of one (1) array region 102 (e.g., the first array region 102A) of a pair of horizontally neighboring array regions 102, and to also facilitate electrical connections between a group of additional word lines (e.g., additional odd word lines or additional even word lines) and a group of additional control logic devices (e.g., additional odd SWD devices or additional even SWD devices) operatively associated with a corresponding portion (e.g., a corresponding half portion in the Y-direction) of a further array region 102 (e.g., the third array region 102C) of the pair of horizontally neighboring array regions 102. In addition, as also described in further detail below, an individual second word line exit subregion 106B may be configured and positioned to facilitate electrical connections between a group of further word lines and a group of further control logic devices operatively associated with another portion (e.g., another half portion in the Y-direction) of the one (1) array region 102 (e.g., the first array region 102A), and to also facilitate electrical connections between a group of yet further word lines and a group of yet further control logic devices operatively associated with a corresponding another portion (e.g., a corresponding another half portion in the Y-direction) of the further array region 102 (e.g., the third array region 102C).

With continued reference to FIG. 1, the socket regions 108 of the first microelectronic device structure 100 may comprise horizontal areas of the first microelectronic device structure 100 configured and positioned to facilitate electrical connections (e.g., by way of contact structures and routing structures formed within horizontal boundaries thereof) between subsequently formed control logic circuitry and additional subsequently formed structures (e.g., BEOL structures), as described in further detail below. The socket regions 108 may horizontally neighbor one or more peripheral horizontal boundaries (e.g., in the Y-direction, in the X-direction) of one or more groups of the array regions 102. For clarity and ease of understanding of the drawings and related description, FIG. 1 depicts the first microelectronic device structure 100 as being formed to include one (1) socket region 108 horizontally neighboring a shared horizontal boundary of the second array region 102B and the fourth array region 102D. However, the first microelectronic device structure 100 may be formed to include one or more of a different quantity and a different horizontal position of socket region(s) 108. As a non-limiting example, the socket region 108 may horizontally neighbor a shared horizontal boundary of a different group of the array regions 102 (e.g., a shared horizontal boundary of the third array region 102C and the fourth array region 102D, a shared horizontal boundary of the first array region 102A and the third array region 102C, a shared horizontal boundary of the first array region 102A and the second array region 102B). As another non-limiting example, the first microelectronic device structure 100 may be formed to include multiple (e.g., a plurality of, more than one) socket regions 108 horizontally neighboring different groups of the array regions 102 than one another. In some embodiments, multiple socket regions 108 collectively substantially horizontally surround (e.g., substantially horizontally circumscribe) the array regions 102.

Figure 2B:
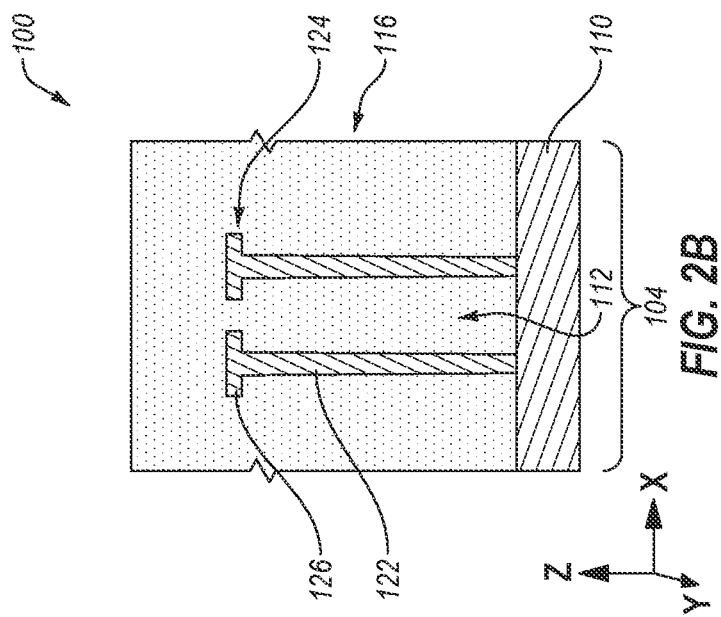
FIGS. 2A through 2D are simplified, partial longitudinal cross-sectional views of an array region (FIG. 2A), a digit line exit region (FIG. 2B), a word line exit region (FIG. 2C), and a socket region (FIG. 2D) of the first microelectronic device structure shown in FIG. 1 at the processing stage of FIG. 1.
Figure 2A:
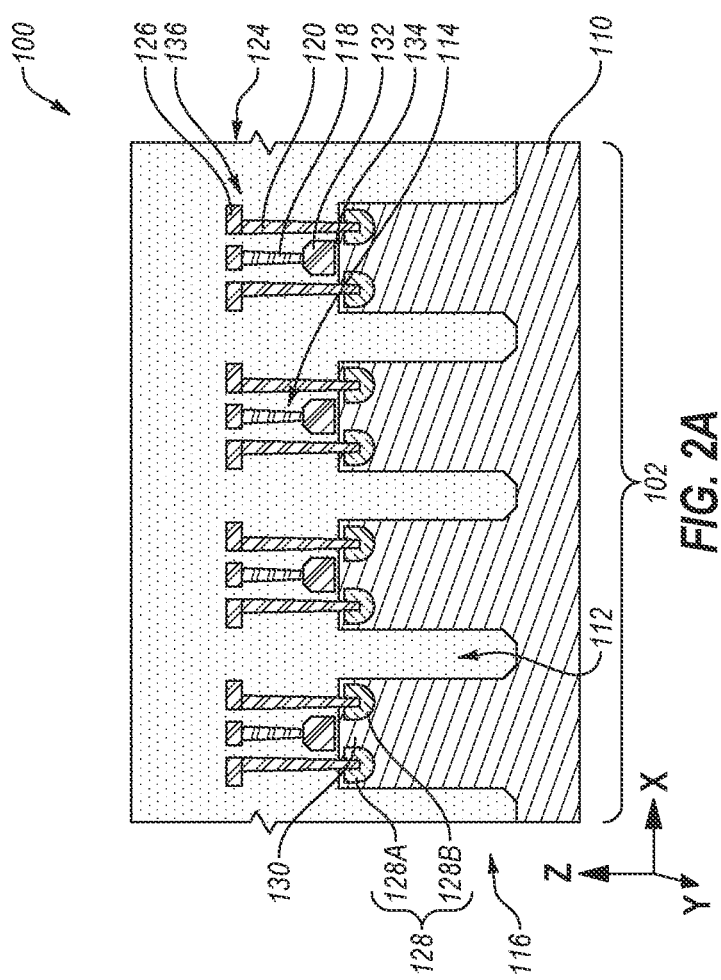
Figure 2D:
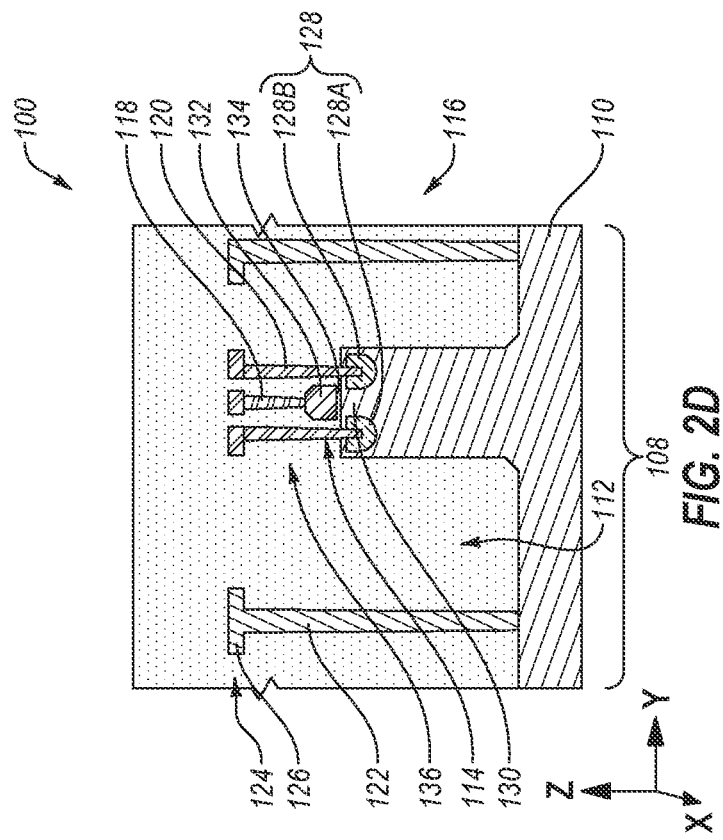
Figure 2C:
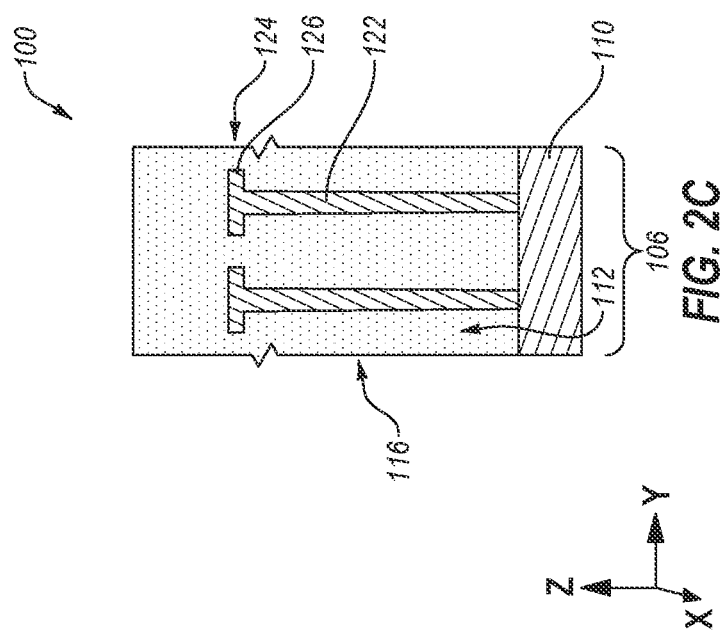

FIGS. 2A through 2D illustrate simplified, partial longitudinal cross-sectional views of different regions of the first microelectronic device structure 100 previously described with reference to FIG. 1. FIG. 2A illustrates a simplified, partial longitudinal cross-sectional view from the perspective of the Y-direction (so as to depict an XZ-plane) of one of the array regions 102 (e.g., the first array region 102A) of the first microelectronic device structure 100 shown in FIG. 1. FIG. 2B illustrates a simplified, partial longitudinal cross-sectional view from the perspective of the Y-direction (so as to depict an XZ-plane) of one of the digit line exit regions 104 of the first microelectronic device structure 100 shown in FIG. 1. FIG. 2C illustrates a simplified, partial longitudinal cross-sectional view from the perspective of the X-direction (so as to depict a YZ-plane) of one of the word line exit regions 106 of the first microelectronic device structure 100 shown in FIG. 1. FIG. 2D illustrates a simplified, partial longitudinal cross-sectional view from the perspective of the X-direction (so as to depict a YZ-plane) of one of socket regions 108 of the first microelectronic device structure 100 shown in FIG. 1.

Referring collectively to FIGS. 2A through 2D, the first microelectronic device structure 100 may be formed to include a first base semiconductor structure 110, filled trenches 112, transistors 114 (FIGS. 2A and 2D), a first isolation material 116, first contact structures 118 (FIGS. 2A and 2D), second contact structures 120 (FIGS. 2A and 2D), third contact structures 122 (FIG. 2D), and at least one first routing tier 124 including first routing structures 126. The filled trenches 112 vertically extend (e.g., in the Z-direction) into the first base semiconductor structure 110. The transistors 114 at least partially vertically overlie the first base semiconductor structure 110 and the filled trenches 112. The first contact structures 118 and second contact structures 120 contact the transistors 114. The third contact structures 122 vertically extend through the filled trenches 112 within the digit line exit regions 104 (FIG. 2B), the word line exit regions 106 (FIG. 2C), and socket regions 108 (FIG. 2D) and contact the first base semiconductor structure 110. Some of the first routing structures 126 contact some of the first contact structures 118 (FIGS. 2A and 2D), some other of the first routing structures 126 contact some of the second contact structures 120 (FIGS. 2A and 2D), and yet some other of the first routing structures 126 contact some of the third contact structures 122 (FIGS. 2B, 2C, and 2D). The first isolation material 116 may substantially cover and surround the first base semiconductor structure 110, the transistors 114, the first contact structures 118, the second contact structures 120, the third contact structures 122, and the first routing structures 126.

The first base semiconductor structure 110 comprises a base material or construction upon which additional features (e.g., materials, structures, devices) of the first microelectronic device structure 100 are formed. The first base semiconductor structure 110 may comprise a semiconductor structure (e.g., a semiconductor wafer), or a base semiconductor material on a supporting structure. For example, the first base semiconductor structure 110 may comprise a conventional silicon substrate (e.g., a conventional silicon wafer), or another bulk substrate comprising a semiconductor material. In some embodiments, the first base semiconductor structure 110 comprises a silicon wafer. The first base semiconductor structure 110 may include one or more layers, structures, and/or regions formed therein and/or thereon.

The filled trenches 112 may comprise trenches (e.g., openings, vias, apertures) within the first base semiconductor structure 110 that are at least partially (e.g., substantially) filled with the first isolation material 116. The filled trenches 112 may, for example, be employed as shallow trench isolation (STI) structures within the first base semiconductor structure 110. The filled trenches 112 may be formed to vertically extend partially (e.g., less than completely) through the first base semiconductor structure 110. Each of the filled trenches 112 may be formed to exhibit substantially the same dimensions and shape as each other of the filled trenches 112, or at least one of the filled trenches 112 may be formed to exhibit one or more of different dimensions and a different shape than at least one other of the filled trenches 112. As a non-limiting example, each of the filled trenches 112 may be formed to exhibit substantially the same vertical dimension(s) and substantially the same vertical cross-sectional shape(s) as each other of the filled trenches 112; or at least one of the filled trenches 112 may be formed to exhibit one or more of different vertical dimension(s) and different vertical cross-sectional shape(s) than at least one other of the filled trenches 112. In some embodiments, the filled trenches 112 are all formed to vertically extend to and terminate at substantially the same depth within the first base semiconductor structure 110. In additional embodiments, at least one of the filled trenches 112 is formed to vertically extend to and terminate at a relatively deeper depth within the first base semiconductor structure 110 than at least one other of the filled trenches 112. As another non-limiting example, each of the filled trenches 112 may be formed to exhibit substantially the same horizontal dimension(s) and substantially the same horizontal cross-sectional shape(s) as each other of the filled trenches 112; or at least one of the filled trenches 112 may be formed to exhibit one or more of different horizontal dimension(s) (e.g., relatively larger horizontal dimension(s), relatively smaller horizontal dimension(s)) and different horizontal cross-sectional shape(s) than at least one other of the filled trenches 112. In some embodiments, at least one of the filled trenches 112 is formed to have one or more different horizontal dimensions (e.g., in the X-direction and/or in the Y-direction) than at least one other of the filled trenches 112.

Referring collectively to FIGS. 2A and 2D, the transistors 114 may individually be formed to include conductively doped regions 128, a channel region 130, a gate structure 132, and a gate dielectric material 134. For a transistor 114, the conductively doped regions 128 may be formed within the first base semiconductor structure 110 (e.g., within an relatively elevated portion of the formed within portions (e.g., relatively elevated portions) of the first base semiconductor structure 110 horizontally neighboring at least one of the filled trenches 112; the channel region 130 may be within the first base semiconductor structure 110 and may be horizontally interposed between the conductively doped regions 128 thereof; the gate structure 132 may vertically overlie the channel region 130; and the gate dielectric material 134 (e.g., a dielectric oxide) may be vertically interposed (e.g., in the Z-direction) between the gate structure 132 and the channel region 130. The conductively doped regions 128 of an individual transistor 114 may include a source region 128A and a drain region 128B.

Referring collectively to FIGS. 2A and 2D, for an individual transistor 114, the conductively doped regions 128 thereof may comprise semiconductor material of the first base semiconductor structure 110 doped with one or more desired conductivity-enhancing dopants. In some embodiments, the conductively doped regions 128 of the transistor 114 comprise semiconductor material (e.g., silicon) doped with at least one N-type dopant (e.g., one or more of phosphorus, arsenic, antimony, and bismuth). In some of such embodiments, the channel region 130 of the transistor 114 comprises the semiconductor material doped with at least one P-type dopant (e.g., one or more of boron, aluminum, and gallium). In some other of such embodiments, the channel region 130 of the transistor 114 comprises substantially undoped semiconductor material (e.g., substantially undoped silicon). In additional embodiments, for an individual transistor 114, the conductively doped regions 128 thereof comprise semiconductor material (e.g., silicon) doped with at least one P-type dopant (e.g., one or more of boron, aluminum, and gallium). In some of such additional embodiments, the channel region 130 of the transistor 114 comprises the semiconductor material doped with at least one N-type dopant (e.g., one or more of phosphorus, arsenic, antimony, and bismuth). In some other of such additional embodiments, the channel region 130 of the transistor 114 comprised substantially undoped semiconductor material (e.g., substantially undoped silicon).

Still referring collectively to FIGS. 2A and 2D, the gate structures 132 (e.g., gate electrodes) may individually horizontally extend (e.g., in the X-direction) between and be employed by multiple transistors 114. The gate structures 132 may be formed of and include conductive material. The gate structures 132 may individually be substantially homogeneous, or the gate structures 132 may individually be heterogeneous. In some embodiments, the gate structures 132 are each substantially homogeneous. In additional embodiments, the gate structures 132 are each heterogeneous. Individual gate structures 132 may, for example, be formed of and include a stack of at least two different conductive materials.

Still referring to FIGS. 2A and 2D, the first contact structures 118 may individually be formed to vertically extend between and couple the gate structures 132 (and, hence, the transistors 114) to one or more of the first routing structures 126 of the first routing tier 124. The first contact structures 118 may individually be formed of and include conductive material. By way of non-limiting example, the first contact structures 118 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, the first contact structures 118 are formed of and include W. In additional embodiments, the first contact structures 118 are formed of and include Cu.

As also shown in FIGS. 2A and 2D, the second contact structures 120 may be formed to vertically extend between and couple the conductively doped regions 128 (e.g., the source region 128A, the drain region 128B) of the transistors 114 to some of the first routing structures 126 of the first routing tier 124. The second contact structures 120 may individually be formed of and include conductive material. By way of non-limiting example, the second contact structures 120 may be formed of and include one or more of at least one metal, at least one alloy, and at least one conductive metal-containing material (e.g., a conductive metal nitride, a conductive metal silicide, a conductive metal carbide, a conductive metal oxide). A material composition of the second contact structures 120 may be substantially the same as a material composition of the first contact structures 118, or the material composition of one or more of the second contact structures 120 may be different than the material composition of one or more of the first contact structures 118. In some embodiments, the second contact structures 120 are formed of and include W. In additional embodiments, the second contact structures 120 are formed of and include Cu.

Referring collectively to FIGS. 2B through 2D, at least some of the third contact structures 122 may vertically extend (e.g., in the Z-direction) between some other of the first routing structures 126 and other portions (e.g., relatively vertically recessed portions) of the first base semiconductor structure 110 within (e.g., inside of) the horizontal boundaries (e.g., in the X-direction and the Y-direction) of some of the filled trenches 112, such as some of the filled trenches 112 within the digit line exit regions 104 (FIG. 2B), the word line exit regions 106 (FIG. 2C), and the socket regions 108 (FIG. 2D) of the first microelectronic device structure 100. As shown in FIGS. 2B through 2D, in some embodiments, at least some of the third contact structures 122 vertically extend from the first routing structures 126, through one or more of the filled trenches 112, and to one or more vertically lower surfaces of the first base semiconductor structure 110 within horizontal boundaries of the one or more of the filled trenches 112. As described in further detail below, at least some of the third contact structures 122 may be employed to facilitate electrical connection between some of the first routing structures 126 and one or more features (e.g., structures, materials, devices) to be formed at an opposing side (e.g., a back side, a bottom side) of the first base semiconductor structure 110 following subsequent processing (e.g., subsequent thinning) of the first base semiconductor structure 110. The third contact structures 122 may each individually be formed of and include conductive material. By way of non-limiting example, the third contact structures 122 be formed of and include one or more of at least one metal, at least one alloy, and at least one conductive metal-containing material (e.g., a conductive metal nitride, a conductive metal silicide, a conductive metal carbide, a conductive metal oxide). In some embodiments, the third contact structures 122 are formed of and include W. In additional embodiments, the third contact structures 122 are formed of and include Cu.

Referring collectively to FIGS. 2A through 2D, the first routing structures 126 of the first routing tier 124 may be formed of and include conductive material. By way of non-limiting example, the first routing structures 126 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, the first routing structures 126 are formed of and include W. In additional embodiments, the first routing structures 126 are formed of and include Cu. At least some of the first routing structures 126 may be employed as local routing structures of a microelectronic device (e.g., a memory device, such as a DRAM device) of the disclosure.

While FIGS. 2A through 2D depict the first microelectronic device structure 100 as being formed to include a single (e.g., only one) first routing tier 124 including first routing structures 126, the first microelectronic device structure 100 may be formed to include multiple (e.g., more than one) first routing tiers 124 each individually including a desired arrangement (e.g., pattern) of first routing structures 126. By of non-limiting example, the first microelectronic device structure 100 may be formed to include two or more (e.g., three or more) of the first routing tiers 124, wherein different first routing tiers 124 are vertically offset from one another and each individually include a desired arrangement of first routing structures 126 therein. At least some of the first routing structures 126 within at least one of the first routing tiers 124 may be coupled to at least some of the first routing structures 126 within at least one other of the first routing tiers 124 by way of conductive interconnect structures.

With continued collective reference to FIGS. 2A though 2D, the transistors 114, the first contact structures 118, the second contact structures 120, and the first routing structures 126 may form control logic circuitry of various control logic devices 136 (FIGS. 2A and 2D) configured to control various operations of various features (e.g., the memory cells) of a microelectronic device (e.g., a memory device, such as a DRAM device) to be formed through the methods of disclosure. In some embodiments, the control logic devices 136 comprise CMOS circuitry. As a non-limiting example, the control logic devices 136 may include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), $V_{dd}$ regulators, drivers (e.g., main word line drivers, sub word line drivers (SWD)), page buffers, decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, array multiplexers (MUX), error checking and correction (ECC) devices, self-refresh/wear leveling devices, and other chip/deck control circuitry. Different regions (e.g., the array region 102 (FIG. 2A), the socket region 108 (FIG. 2D)) may have different control logic devices 136 formed within horizontal boundaries thereof.

Still referring to collectively to FIGS. 2A through 2D, the first isolation material 116 may be formed on or over surfaces of the first base semiconductor structure 110 inside and outside of the horizontal boundaries of the filled trenches 112. In addition, the first isolation material 116 may be formed on or over surfaces of the transistors 114, the first contact structures 118 (FIGS. 2A and 2D), the second contact structures 120 (FIGS. 2A and 2D), the third contact structures 122 (FIGS. 2B through 2D), and the first routing structures 126. An uppermost vertical boundary (e.g., an uppermost surface) of the first isolation material 116 may vertically overlie uppermost vertical boundaries (e.g., uppermost surfaces) of the first routing structures 126. As described in further detail below, the first isolation material 116 may be employed to attach (e.g., bond) the first microelectronic device structure 100 to a second microelectronic device structure (e.g., a second wafer). The first isolation material 116 may be formed of and include at least one insulative material. By way of non-limiting example, the first isolation material 116 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, and $TiO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the first isolation material 116 is formed of and includes $SiO_x$ (e.g., $SiO_2$). The first isolation material 116 may be substantially homogeneous, or the first isolation material 116 may be heterogeneous. In some embodiments, the first isolation material 116 is substantially homogeneous. In additional embodiments, the first isolation material 116 is heterogeneous. The first isolation material 116 may, for example, be formed of and include a stack of at least two different dielectric materials.

Figure 3:
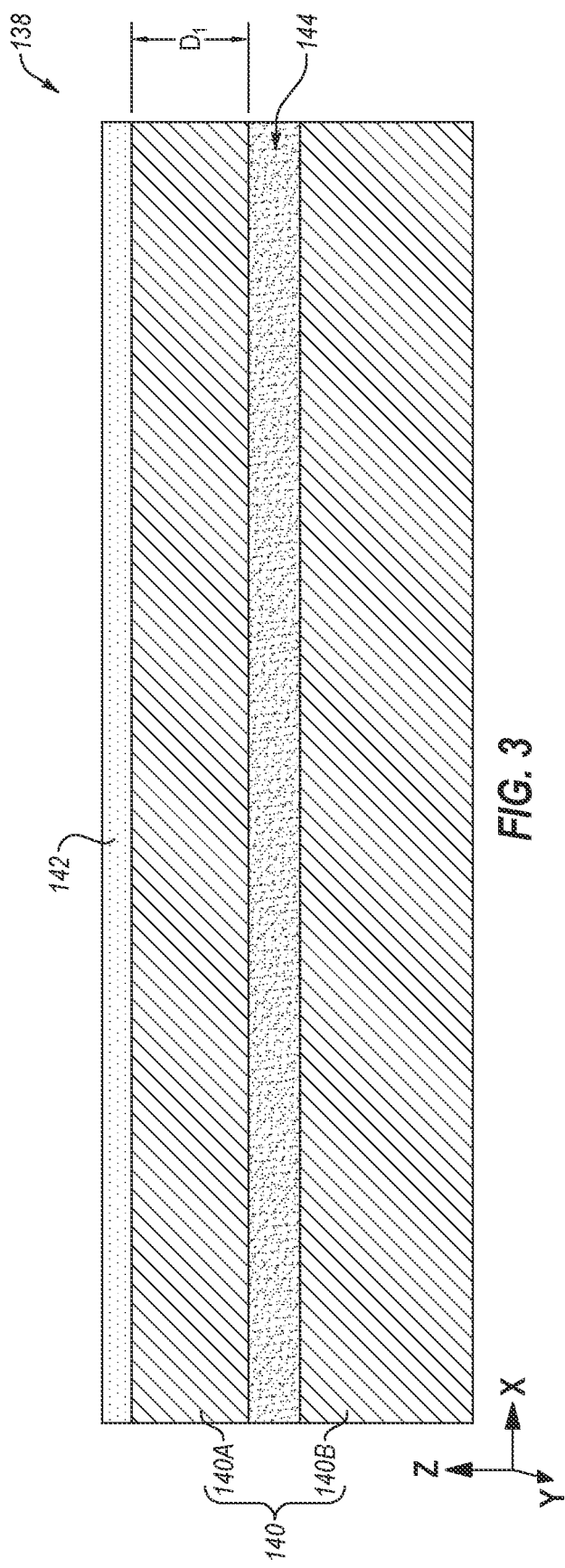
FIG. 3 is a simplified, partial longitudinal cross-sectional view of a second microelectronic device structure at a processing stage of the method of forming a microelectronic device, in accordance with embodiments of the disclosure.
Figure 4D:
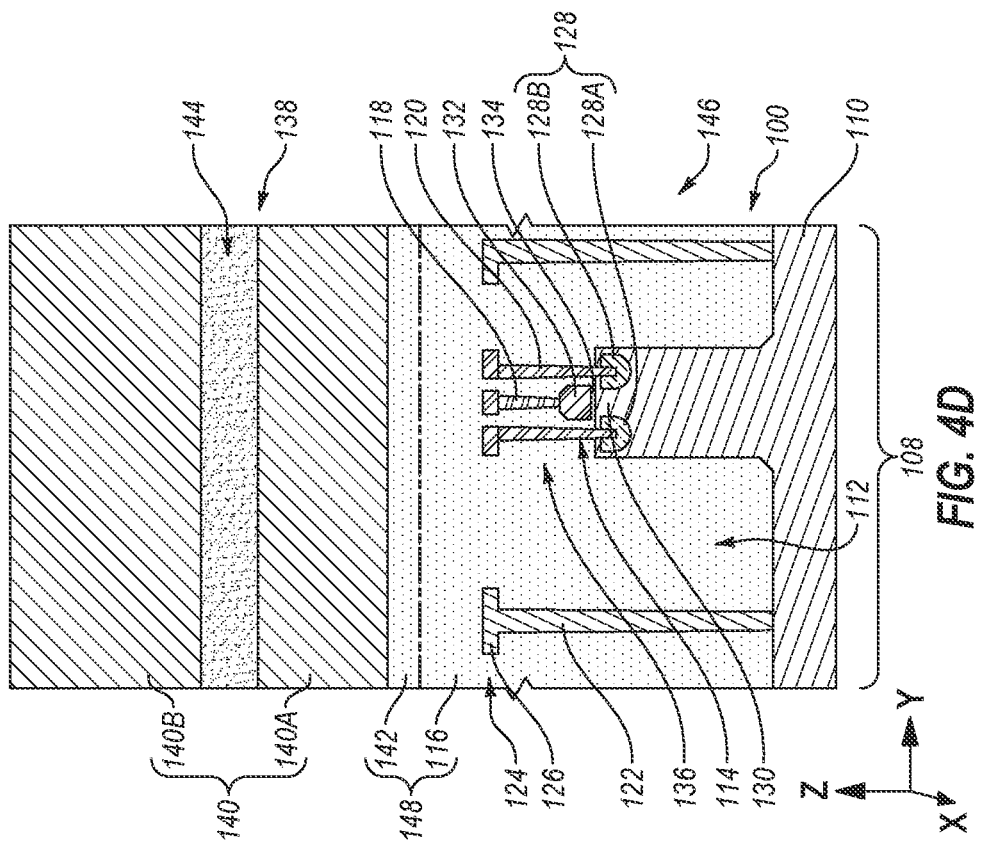
Figure 4C:
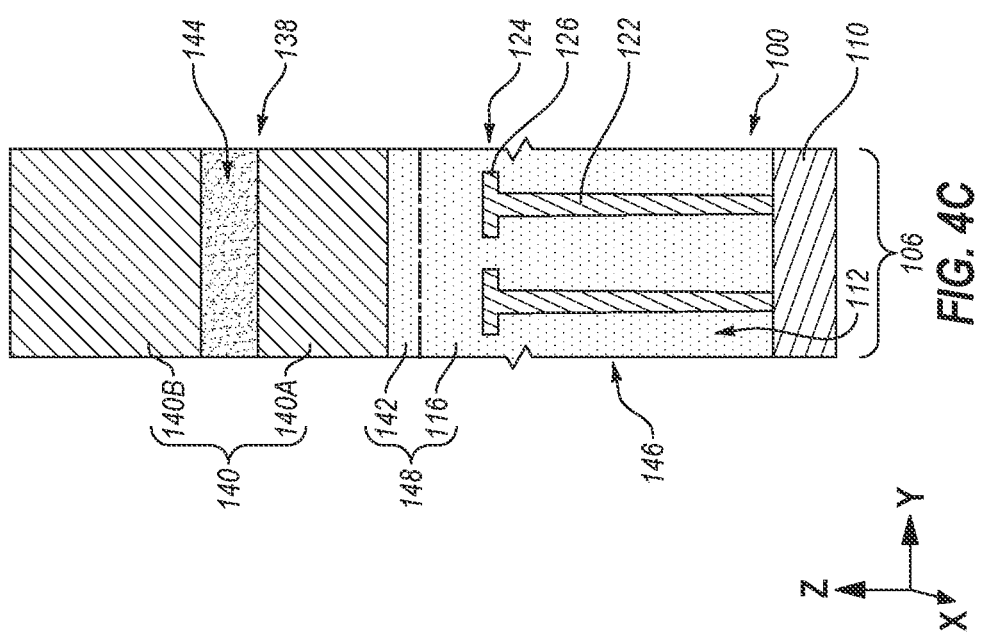

Referring next to FIG. 3, illustrated is simplified, partial longitudinal cross-sectional view from the perspective of the Y-direction (so as to depict an XZ-plane) of a second microelectronic device structure 138 (e.g., a second wafer) may be formed to include a second base semiconductor structure 140 and a second isolation material 142 formed on, over, or within the second base semiconductor structure 140. The second microelectronic device structure 138 may be formed separate from the first microelectronic device structure 100 (FIGS. 1 and 2A through 2D). Following separate formation, the second microelectronic device structure 138 may be attached to the first microelectronic device structure 100 (FIGS. 1 and 2A through 2D), as described in further detail below with reference to FIGS. 4A through 4D.

The second base semiconductor structure 140 of the second microelectronic device structure 138 comprises a base material or construction upon which additional features (e.g., materials, structures, devices) of the formed. In some embodiments, the second base semiconductor structure 140 comprises a wafer. The second base semiconductor structure 140 may be formed of and include a semiconductor material (e.g., one or more of a silicon material, such monocrystalline silicon or polycrystalline silicon; silicon-germanium; germanium; gallium arsenide; a gallium nitride; gallium phosphide; indium phosphide; indium gallium nitride; and aluminum gallium nitride). By way of non-limiting example, the second base semiconductor structure 140 may comprise a semiconductor wafer (e.g., a silicon wafer). The second base semiconductor structure 140 may include one or more layers, structures, and/or regions formed therein and/or thereon.

As shown in FIG. 3, optionally, the second base semiconductor structure 140 may include at least one detachment region 144 therein configured to promote or facilitate detachment of a portion 140A of the second base semiconductor structure 140 proximate (e.g., adjacent) the second isolation material 142 from an additional portion 140B of the second base semiconductor structure 140 relatively more distal from the second isolation material 142. By way of non-limiting example, the detachment region 144 may include one more of dopants (e.g., hydrogen), void spaces, and/or structural features (e.g., defects, damage) promoting or facilitating subsequent detachment of the portion 140A from the additional portion 140B, as described in further detail below. A vertical depth Di (e.g., in the Z-direction) of the detachment region 144 within the second base semiconductor structure 140 may correspond to desired vertical height of the portion 140A of the second base semiconductor structure 140. The vertical height of the portion 140A may be selected at least partially based on desired configuration of additional features (e.g., structures, materials, devices) to be formed using the portion 140A of the second base semiconductor structure 140 following the detachment thereof from the additional portion 140B of the second base semiconductor structure 140. In some embodiments, the vertical depth Di of the detachment region 144 (and, hence, the vertical height of the portion 140A of the second base semiconductor structure 140) is within a range of from about 400 nanometers (nm) to about 800 nm. In additional embodiments, the detachment region 144 is absent from the second base semiconductor structure 140. In some of such embodiments, the additional portion 140B of the second base semiconductor structure 140 may subsequently be removed relative to the portion 140A of the second base semiconductor structure 140 through a different process (e.g., a non-detachment-based process, such as a conventional grinding process).

The second isolation material 142 of the second microelectronic device structure 138 may be formed of and include at least one insulative material. A material composition of the second isolation material 142 of the second microelectronic device structure 138 may be substantially the same as a material composition of the first isolation material 116 (FIGS. 2A through 2D) of the first microelectronic device structure 100 (FIGS. 1 and 2A through 2D); or the material composition of the second isolation material 142 may be different than the material composition of the first isolation material 116 (FIGS. 2A through 2D). In some embodiments, the second isolation material 142 is formed of and includes a dielectric oxide material, such as $SiO_x$ (e.g., $SiO_2$). The second isolation material 142 may be substantially homogeneous, or the second isolation material 142 may be heterogeneous. In some embodiments, the second isolation material 142 is substantially homogeneous. In additional embodiments, the second isolation material 142 is heterogeneous. The second isolation material 142 may, for example, be formed of and include a stack of at least two different dielectric materials.

Referring next to FIGS. 4A through 4D, illustrated are simplified, partial longitudinal cross-sectional views, from the directional perspectives previously described, of the array region 102 (FIG. 4A), the digit line exit region 104 (FIG. 4B), the word line exit region 106 (FIG. 4C), and the socket region 108 (FIG. 4D) previously described with reference to FIGS. 2A through 2D at a processing stage of the method of forming the microelectronic device following the processing stages previously described with reference to FIGS. 1, 2A through 2D, and 3. While the different regions shown in FIGS. 4A through 4D were previously described as different regions of the first microelectronic device structure 100, it will be understood that these regions are not limited to the features (e.g., structures, materials, devices) and/or portions of features of the first microelectronic device structure 100 previously described with reference to FIGS. 1 and 2A through 2D. Instead, these regions may evolve to encompass and include additional features (e.g., additional structures, additional materials, additional devices), portions of additional features, and/or modified features provided within horizontal boundaries thereof as a result of additional processing stages of the method of forming the microelectronic device following the processing stage previously described with reference to FIGS. 1 and 2A through 2D. These regions, as evolved through the method of forming the microelectronic device of the disclosure, become portions of a microelectronic device of the disclosure.

As depicted in FIGS. 4A through 4D, the second microelectronic device structure 138 may be vertically inverted (e.g., flipped upside down in the Z-direction) and the second isolation material 142 thereof may be attached (e.g., bonded, such as through oxide-oxide bonding) to the first isolation material 116 of the first microelectronic device structure 100 to form a microelectronic device structure assembly 146. Attaching (e.g., bonding) the second isolation material 142 of the second microelectronic device structure 138 to the first isolation material 116 of the first microelectronic device structure 100 may form a first connected isolation structure 148 of the microelectronic device structure assembly 146. Alternatively, the first microelectronic device structure 100 may be vertically inverted (e.g., flipped upside down in the Z-direction) and attached to the second microelectronic device structure 138 to form the microelectronic device structure assembly 146.

To form the first connected isolation structure 148 of the microelectronic device structure assembly 146, after physically contacting the first isolation material 116 of the first microelectronic device structure 100 with the second isolation material 142 of the second microelectronic device structure 138, the first microelectronic device structure 100 and the second microelectronic device structure 138 may be exposed to annealing conditions to form bonds (e.g., oxide-to-oxide bonds) between the first isolation material 116 and the second isolation material 142. By way of non-limiting example, the first isolation material 116 and the second isolation material 142 may be exposed to a temperature greater than or equal to about 400° C. (e.g., within a range of from about 400° C. to about 800° C., greater than about 800° C.) to form oxide-to-oxide bonds between the first isolation material 116 and the second isolation material 142. In some embodiments, the first isolation material 116 and the second isolation material 142 are exposed to at least one temperature greater than about 800° C. to form oxide-to-oxide bonds between first isolation material 116 and the second isolation material 142 and attach the first microelectronic device structure 100 to the second microelectronic device structure 138.

While the first isolation material 116 and the second isolation material 142 of the first connected isolation structure 148 of the microelectronic device structure assembly 146 are distinguished from one another in FIGS. 4A through 4D by way of a dashed line, the first isolation material 116 and the second isolation material 142 may be integral and continuous with one another. Put another way, the first connected isolation structure 148 may be a substantially monolithic structure including the first isolation material 116 as a first region (e.g., a vertically lower region) thereof, and the second isolation material 142 as a second region (e.g., a vertically upper region) thereof. For the first connected isolation structure 148, the first isolation material 116 thereof may be attached to the second isolation material 142 thereof without a bond line.

Still referring to FIGS. 4A through 4D, attaching the second microelectronic device structure 138 to the first microelectronic device structure 100 to form the microelectronic device structure assembly 146 in the manner described above may facilitate forming individual socket regions 108 (FIG. 4D) to have a relatively reduced horizontal area as compared to conventional microelectronic device configurations. For example, by attaching the second microelectronic device structure 138 to the first microelectronic device structure 100 prior to forming various devices (e.g., access devices, storage node device) and associated additional interconnect features (e.g., contact structures, routing structures) of a microelectronic device of the disclosure, various alignment considerations may be alleviated and the horizontal footprint that would otherwise be needed to account for such alignment considerations may be reduced. The horizontal area of an individual socket region 108 (FIG. 4D) may, for example, be from about 40 percent to about 60 percent smaller than the horizontal area of a conventional socket region of a conventional microelectronic device configuration. Such socket region size reduction may facilitate relatively enhanced areal density for sub-20 nanometer (nm) technology nodes.

Referring next to FIGS. 5A through 5D, illustrated are simplified, partial longitudinal cross-sectional views, from the directional perspectives previously described, of the array region 102 (FIG. 5A), the digit line exit region 104 (FIG. 5B), the word line exit region 106 (FIG. 5C), and the socket region 108 (FIG. 5D) at a processing stage of the method of forming the microelectronic device following the processing stage previously described with reference to FIGS. 4A through 4D. As depicted in FIGS. 5A through 5D, the additional portion 140B (FIGS. 4A through 4D) of the second base semiconductor structure 140 (FIGS. 4A through 4D) is removed while at least partially maintaining the portion 140A (FIGS. 4A through 4D) of the second base semiconductor structure 140 (FIGS. 4A through 4D), and then the at least partially maintained portion 140A (FIGS. 4A through 4D) may be patterned to form a first semiconductor tier 150 including first semiconductor structures 152. The first semiconductor structures 152 may be employed to subsequently form additional features (e.g., structures; devices, such as transistors), as described in further detail below. In addition, a third isolation material 154 may be formed horizontally adjacent the first semiconductor structures 152 of the first semiconductor tier 150.

The additional portion 140B (FIGS. 4A through 4D) of the second base semiconductor structure 140 (FIGS. 4A through 4D) may be removed using conventional processes (e.g., a detachment process; a wafer thinning process, such as a grinding processes) and conventional processing equipment, which are not described in detail herein. By way of non-limiting example, in some embodiments wherein the second base semiconductor structure 140 (FIGS. 4A through 4D) includes the detachment region 144 (FIGS. 4A through 4D) including one more of dopants (e.g., hydrogen), void spaces, and/or structural features (e.g., defects, damage) promoting or facilitating subsequent detachment of the portion 140A (FIGS. 4A through 4D) from the additional portion 140B (FIGS. 4A through 4D), the second base semiconductor structure 140 (FIGS. 4A through 4D) may be acted upon to effectuate such detachment at or proximate the detachment region 144 (FIGS. 4A through 4D). In addition, parts of the portion 140A (FIGS. 4A through 4D) of the second base semiconductor structure 140 (FIGS. 4A through 4D) maintained following the removal of the additional portion 140B (FIGS. 4A through 4D) of the second base semiconductor structure 140 (FIGS. 4A through 4D) may be further processed (e.g., polished, patterned) to form the first semiconductor structures 152 of the first semiconductor tier 150 using conventional processes (e.g., conventional CMP processes, conventional masking processes, conventional etching processes) and conventional processing equipment, which are also not described in detail herein. A vertical height (e.g., in the Z-direction) of the first semiconductor structures 152 may be less than or equal to the vertical height of the portion 140A (FIGS. 4A through 4D) of the second base semiconductor structure 140 (FIGS. 4A through 4D). In some embodiments, the vertical height of the first semiconductor structures 152 is formed to be less than the vertical height of the portion 140A (FIGS. 4A through 4D) of the second base semiconductor structure 140 (FIGS. 4A through 4D). For example, the vertical height of the first semiconductor structures 152 may be formed to be within a range of from about 100 nm to about 300 nm, such as from about 150 nm to about 250 nm, or about 200 nm.

As collectively depicted in FIGS. 5A through 5D, following the processing of the additional portion 140B (FIGS. 4A through 4D) of the second base semiconductor structure 140 (FIGS. 4A through 4D), some of the regions (e.g., the array region 102 shown in FIG. 5A, the socket region 108 shown in FIG. 5D) include the resulting first semiconductor structures 152, and some other of the regions (e.g., the digit line exit region 104 shown in FIG. 5B, the word line exit region 106 shown in FIG. 5C) are substantially free of the resulting first semiconductor structures 152. For example, the array region 102 shown in FIG. 5A may include some of the first semiconductor structures 152, wherein horizontally neighboring first semiconductor structures 152 are separated from one another by the third isolation material 154. As another example, each of the digit line exit region 104 shown in FIG. 5B and the word line exit region 106 shown in FIG. 5C may be substantially free of the first semiconductor structures 152. As collectively illustrated in FIGS. 5A through 5D, in some embodiments, an upper surface of the third isolation material 154 is formed to be substantially coplanar with upper surfaces of the first semiconductor structures 152 of the first semiconductor tier 150.

The third isolation material 154 may be formed of and include at least one insulative material. A material composition of the third isolation material 154 may be substantially the same as a material composition of the first connected isolation structure 148, or the material composition of the fourth isolation material 170 may be different than the material composition of the first connected isolation structure 148. In some embodiments, the third isolation material 154 is formed of and includes a dielectric oxide material, such as $SiO_x$ (e.g., $SiO_2$). The third isolation material 154 may be substantially homogeneous, or the third isolation material 154 may be heterogeneous. In some embodiments, the third isolation material 154 is substantially homogeneous. In additional embodiments, the third isolation material 154 is heterogeneous. The third isolation material 154 may, for example, be formed of and include a stack of at least two different dielectric materials.

Figure 6D:
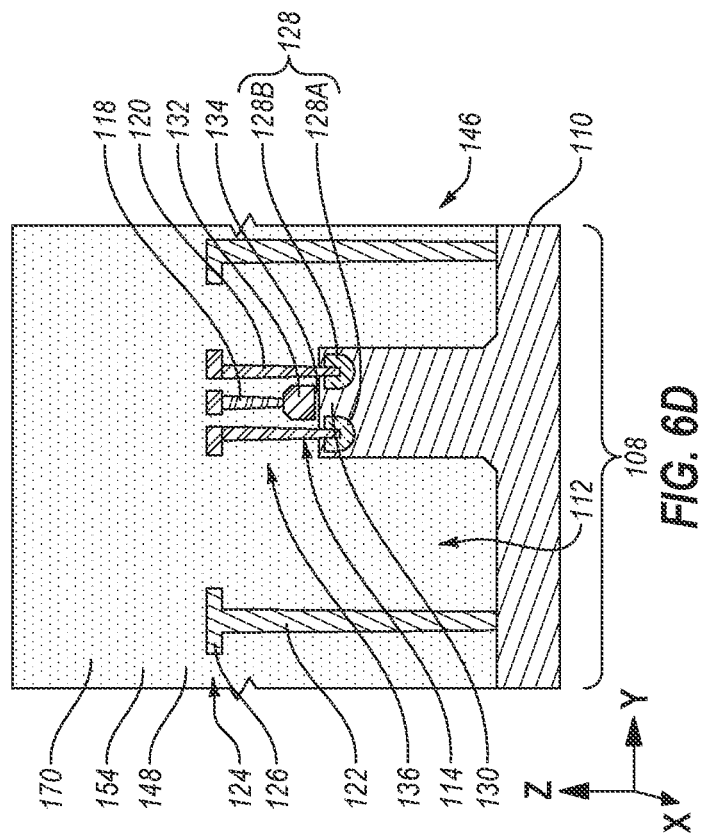
Figure 6C:
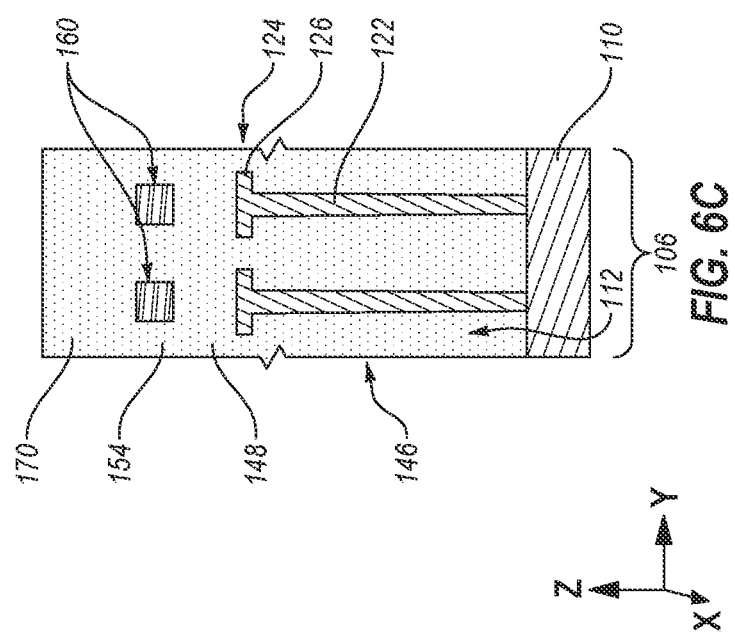

Referring next to FIGS. 6A through 6D, illustrated are simplified, partial longitudinal cross-sectional views, from the directional perspectives previously described, of the array region 102 (FIG. 6A), the digit line exit region 104 (FIG. 6B), the word line exit region 106 (FIG. 6C), and the socket region 108 (FIG. 6D) at a processing stage of the method of forming the microelectronic device following the processing stage previously described with reference to FIGS. 5A through 5D. As collectively depicted in FIGS. 6A through 6D, access devices 156 (FIG. 6A) (e.g., access transistors) may be formed within the array region 102 (FIG. 6A). In addition, digit lines 158 (FIGS. 6A and 6B) (e.g., data lines, bit lines) may be formed to be coupled to the access devices 156 (FIG. 6A) and to horizontally extend in the Y-direction through the array region 102 (FIG. 6A). At least some of the digit lines 158 (FIGS. 6A and 6B) may terminate (e.g., end) within the digit line exit region 104 (FIG. 6B). Furthermore, word lines 160 (e.g., access lines) may be formed to be coupled to the access devices 156 (FIG. 6A) and to horizontally extend in the X-direction through the array region 102 (FIG. 6A). At least some of the word lines 160 (FIGS. 6A and 6C) may terminate within the word line exit region 106 (FIG. 6C).

Referring to FIG. 6A, the access devices 156 formed within the array region 102 may be employed as components of memory cells (e.g., DRAM cells) to be formed within the array region 102. By way of non-limiting example, each access device 156 may individually be formed to include a channel region comprising a portion of one of the first semiconductor structures 152; a source region and a drain region each individually comprising one or more of at least one conductively doped portion of the one first semiconductor structures 152 and/or at least one conductive structure formed in, on, or over the one of the first semiconductor structures 152; and at least one gate structure comprising a portion of at least one of the word lines 160. Each access device 156 may also include a gate dielectric material (e.g., a dielectric oxide material) formed to be interposed between the channel region thereof and the gate structure thereof.

The digit lines 158 may exhibit horizontally elongate shapes extending in parallel in the Y-direction; and the word lines 160 may exhibit horizontally elongate shapes extending in parallel in the X-direction orthogonal to the Y-direction. As used herein, the term "parallel" means substantially parallel. The digit lines 158 and the word lines 160 may each individually be formed of and include conductive material. By way of non-limiting example, the digit lines 158 and the word lines 160 may each individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, the digit lines 158 and the word lines 160 are each individually formed of and include one or more of W, Ru, Mo, and titanium nitride ($TiN_y$). Each of the digit lines 158 and each of the word lines 160 may individually be substantially homogeneous, or one or more of the digit lines 158 and/or one or more of the word lines 160 may individually be substantially heterogeneous. In some embodiments, each of the digit lines 158 and each of the word lines 160 are formed to be substantially homogeneous.

Still referring to FIG. 6A, within the array region 102, additional features (e.g., structures, materials) are also formed on, over, and/or between the access devices 156, the digit lines 158, and the word lines 160. For example, as shown in FIG. 6A, fourth contact structures 162 (e.g., digit line contact structures, also referred to as so-called "bitcon" structures) may be formed to vertically extend between and couple the access devices 156 to the digit lines 158; fifth contact structures 164 (e.g., cell contact structures, also referred to as so-called "cellcon" structures) may be formed in contact with the access devices 156 and may configured and positioned to couple the access devices 156 to subsequently formed storage node devices (e.g., capacitors); dielectric cap structures 166 may be formed on or over the digit lines 158; and additional dielectric cap structures 168 may be formed on or over the word lines 160. The fourth contact structures 162 and the fifth contact structures 164 may individually be formed of and include at least one conductive material. In some embodiments, the fourth contact structures 162 and the fifth contact structures 164 are individually formed of and include one or more of at least one metal (e.g., W), at least one alloy, at least one conductive metal silicide (e.g., one or more of titanium silicide ($TiSi_x$), cobalt silicide ($CoSi_x$), tungsten silicide ($WSi_x$), tantalum silicide ($TaSi_x$), molybdenum silicide ($MoSi_x$), and nickel silicide ($NiSi_x$)), and at least one conductive metal nitride (e.g., one or more of titanium nitride ($TiN_y$), tungsten nitride ($WN_y$), tantalum nitride ($TaN_y$), cobalt nitride ($CoN_y$), molybdenum nitride ($MoN_y$), and nickel nitride ($NiN_y$)). In addition, the dielectric cap structures 166 and the additional dielectric cap structures 168 may individually be formed of and include at least one insulative material. In some embodiments, the dielectric cap structures 166 and the additional dielectric cap structures 168 are individually formed of and include a dielectric nitride material (e.g., $SiN_y$, such as $Si_3N_4$).

Referring to FIG. 6B, within the digit line exit region 104, at least some of the digit lines 158 may horizontally terminate (e.g., end) in the Y-direction. Each of the digit lines 158 horizontally extending through the array region 102 (FIG. 6A) and horizontally terminating within the digit line exit region 104 may be formed to terminate at substantially the same horizontal position in the Y-direction; or at least one of the digit lines 158 horizontally terminating within the digit line exit region 104 may be formed to terminate at a different horizontal position in the Y-direction within the digit line exit region 104 than at least one other of the digit lines 158 horizontally terminating within the digit line exit region 104. In some embodiments, at least some digit lines 158 horizontally neighboring one another in the X-direction have terminal ends (e.g., terminal surfaces) horizontally offset from one another in the Y-direction. Horizontally offsetting the terminal ends of some of the digit lines 158 from the terminal ends of some other of the digit lines 158 within the digit line exit region 104 may, for example, promote or facilitate desirable contact structure arrangements within the digit line exit region 104.

Referring next to FIG. 6C, within the word line exit region 106, at least some of the word lines 160 may horizontally terminate (e.g., end) in the X-direction. Each of the word lines 160 horizontally extending through the array region 102 (FIG. 6A) and horizontally terminating within the word line exit region 106 may be formed to terminate at substantially the same horizontal position in the X-direction; or at least one of the word lines 160 horizontally terminating within the word line exit region 106 may be formed to terminate at a different horizontal position in the X-direction within the word line exit region 106 than at least one other of the word lines 160 horizontally terminating within the word line exit region 106. In some embodiments, at least some word lines 160 horizontally neighboring one another in the Y-direction have terminal ends (e.g., terminal surfaces) horizontally offset from one another in the X-direction. Horizontally offsetting the terminal ends of some of the word lines 160 from the terminal ends of some other of the word lines 160 within the word line exit region 106 may, for example, promote or facilitate desirable contact structure arrangements within the word line exit region 106.

Referring collectively to FIGS. 6A through 6D, a fourth isolation material 170 may be formed on or over portions of at least the access devices 156 (FIG. 6A), the digit lines 158 (FIGS. 6A and 6B), the word lines 160 (FIGS. 6A and 6C), the fifth contact structures 164, and the third isolation material 154. The fourth isolation material 170 may be formed of and include at least one insulative material. A material composition of fourth isolation material 170 may be substantially the same as a material composition of the third isolation material 154, or the material composition of the fourth isolation material 170 may be different than the material composition of the third isolation material 154. In some embodiments, the fourth isolation material 170 is formed of and includes a dielectric oxide material, such as $SiO_x$ (e.g., $SiO_2$). The fourth isolation material 170 may be substantially homogeneous, or the fourth isolation material 170 may be heterogeneous. In some embodiments, the fourth isolation material 170 is substantially homogeneous. In additional embodiments, the fourth isolation material 170 is heterogeneous. The fourth isolation material 170 may, for example, be formed of and include a stack of at least two different dielectric materials.

Figure 7B:
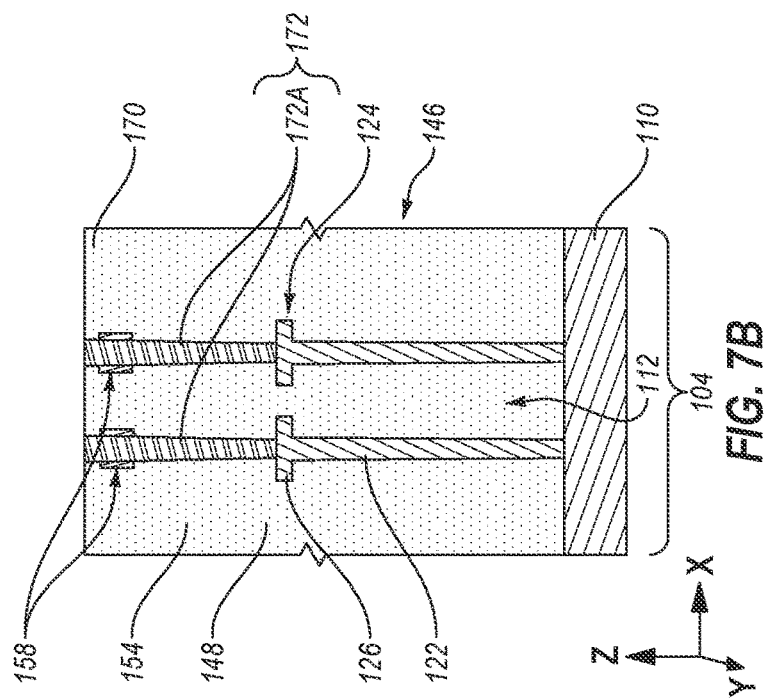
Figure 7A:
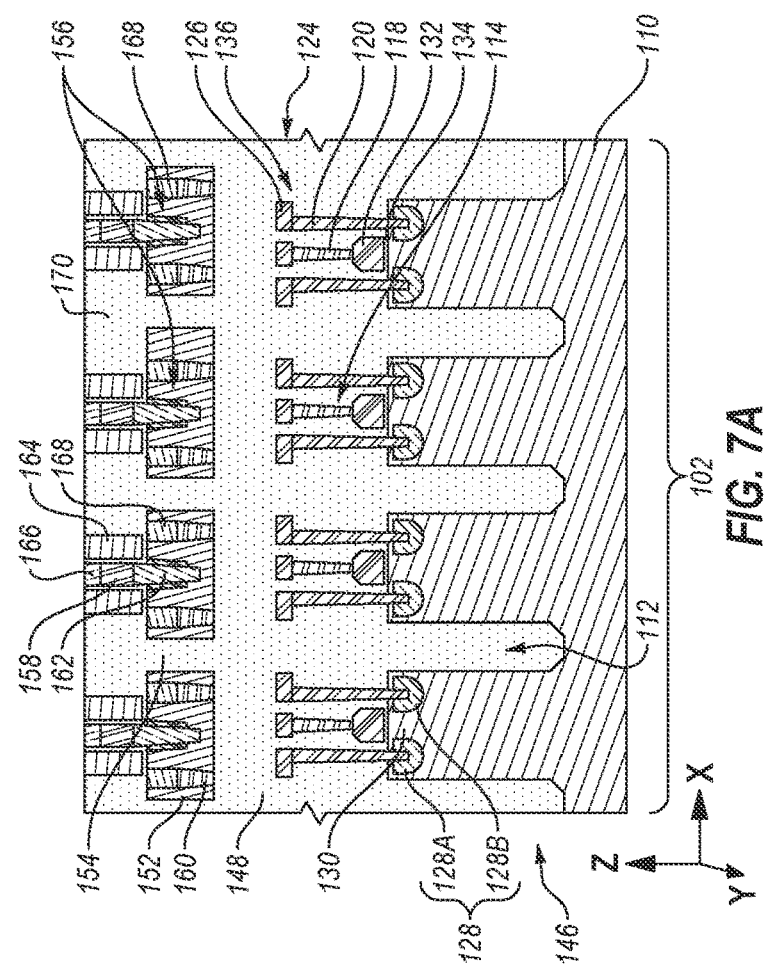

Referring next to FIGS. 7A through 7D, illustrated are simplified, partial longitudinal cross-sectional views, from the directional perspectives previously described, of the array region 102 (FIG. 7A), the digit line exit region 104 (FIG. 7B), the word line exit region 106 (FIG. 7C), and the socket region 108 (FIG. 7D) at a processing stage of the method of forming the microelectronic device following the processing stage previously described with reference to FIGS. 6A through 6D. As collectively depicted in FIGS. 7A through 7D, sixth contact structures 172 may be formed within each of the digit line exit region 104 (FIG. 7B), the word line exit region 106 (FIG. 7C), and the socket region 108 (FIG. 7D). The sixth contact structures 172 may be formed to vertically extend (e.g., in the Z-direction) to and contact the first routing structures 126 of the first routing tier 124. In addition, as described in further detail below, some of the sixth contact structures 172 may be formed to be contact to portions of the digit lines 158 (FIG. 7B) within the digit line exit region 104 (FIG. 7B), and some other of the sixth contact structures 172 may be formed to be contact to portions of the word lines 160 (FIG. 7C) within the word line exit region 106 (FIG. 7C).

Referring to FIG. 7B, within the digit line exit region 104, a first group 172A of the sixth contact structures 172 may be formed to contact at least some of the digit lines 158 horizontally extending (e.g., in the Y-direction) into the digit line exit region 104. Each sixth contact structure 172 of the first group 172A of sixth contact structures 172 may be considered to be a digit line contact structure (e.g., a so-called "edge of array" digit line contact structure). As shown in FIG. 7B, each sixth contact structure 172 of the first group 172A of sixth contact structures 172 may be formed to physically contact and vertically extend completely through an individual digit line 158. For example, within the digit line exit region 104, each sixth contact structure 172 of the first group 172A may be formed to physically contact and vertically extend through each of the fourth isolation material 170, one of the digit lines 158, the third isolation material 154, and the first connected isolation structure 148. Outer sidewalls of each sixth contact structure 172 of the first group 172A of the sixth contact structures 172 may physically contact inner sidewalls of an individual digit line 158. In addition, each sixth contact structure 172 of the first group 172A may be formed to vertically terminate on or within one of the first routing structures 126 located within the digit line exit region 104. Accordingly, each sixth contact structure 172 of the first group 172A may be formed to be coupled to one of the digit lines 158 and to one of the first routing structures 126.

Referring next to FIG. 7C, within the word line exit region 106, a second group 172B of the sixth contact structures 172 may be formed to contact at least some of the word lines 160 horizontally extending (e.g., in the X-direction) into the word line exit region 106. Each sixth contact structure 172 of the second group 172B of sixth contact structures 172 may be considered to be a word line contact structure (e.g., a so-called "edge of array" word line contact structure). As shown in FIG. 7C, each sixth contact structure 172 of the second group 172B of sixth contact structures 172 may be formed to physically contact and vertically extend completely through an individual word line 160. For example, within the word line exit region 106, each sixth contact structure 172 of the second group 172B may be formed to physically contact and vertically extend through each of the fourth isolation material 170, one of the word lines 160, the third isolation material 154, and the first connected isolation structure 148. Outer sidewalls of each sixth contact structure 172 of the second group 172B of the sixth contact structures 172 may physically contact inner sidewalls of an individual word line 160. In addition, each sixth contact structure 172 of the second group 172B may be formed to vertically terminate on or within one of the first routing structures 126 located within the word line exit region 106. Accordingly, each sixth contact structure 172 of the second group 172B may be formed to be coupled to one of the word lines 160 and to one of the first routing structures 126.

Referring next to FIG. 7D, within the socket region 108, a third group 172C of the sixth contact structures 172 may be formed to vertically extend to the first routing structures 126 located within the socket region 108. Each sixth contact structure 172 of the third group 172C of sixth contact structures 172 may be considered to be a deep contact structure (e.g., a deep contact structure to be electrically connected to one or more BEOL structures to subsequently be formed). Within the socket region 108, each sixth contact structure 172 of the third group 172C may be formed to physically contact and vertically extend through each of the fourth isolation material 170, the third isolation material 154, and the first connected isolation structure 148; and may vertically terminate on or within one of the first routing structures 126 located within the socket region 108.

Collectively referring again to FIGS. 7A through 7D, the sixth contact structures 172, including the first group 172A (FIG. 7B), the second group 172B (FIG. 7C), and the third group 172C (FIG. 7D) thereof, may be formed of and include conductive material. By way of non-limiting example, the sixth contact structures 172 may each individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, the sixth contact structures 172 are each individually formed of and include W. Each of the sixth contact structures 172 may be substantially homogeneous, or one or more of the sixth contact structures 172 may individually be heterogeneous. In some embodiments, each of the sixth contact structures 172 is substantially homogeneous. In additional embodiments, each of the sixth contact structures 172 is heterogeneous. Each sixth contact structure 172 may, for example, be formed of and include a stack of at least two different conductive materials.

Referring next to FIGS. 8A through 8D, illustrated are simplified, partial longitudinal cross-sectional views, from the directional perspectives previously described, of the array region 102 (FIG. 8A), the digit line exit region 104 (FIG. 8B), the word line exit region 106 (FIG. 8C), and the socket region 108 (FIG. 8D) at a processing stage of the method of forming the microelectronic device following the processing stage previously described with reference to FIGS. 7A through 7D. As collectively depicted in FIGS. 8A through 8D, at least one second routing tier 174 including second routing structures 176 may be formed over the access devices 156 (FIG. 8A) and the sixth contact structures 172 (FIGS. 8B through 8D); storage node devices 178 (e.g., capacitors) may be formed over and in electrical communication with at least some of the second routing structures 176 within the array region 102 (FIG. 8A); seventh contact structures 180 may be formed over and in electrical communication with at least some of the second routing structures 176 within the socket region 108 (FIG. 8D); and at least one third routing tier 182 including third routing structures 184 may be formed over the storage node devices 178 and the seventh contact structures 180.

With continued collective reference to FIGS. 8A through 8D, the second routing structures 176 of the second routing tier 174 may be employed to facilitate electrical communication between additional features (e.g., structures, materials, devices) coupled thereto. The second routing structures 176 may each individually be formed of and include conductive material. By way of non-limiting example, the second routing structures 176 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, the second routing structures 176 are formed of and include W.

Referring to FIG. 8A, within the array region 102, at least some of the second routing structures 176 may be formed and configured to couple the access devices 156 to the storage node devices 178 (e.g., capacitors) to form memory cells 186 (e.g., DRAM cells) within the array region 102. Each memory cell 186 may individually include one of the access devices 156; one of the storage node devices 178; one of the fifth contact structures 164 interposed between the access device 156 and the storage node device 178; and one of the second routing structures 176 interposed between the fifth contact structure 164 and the storage node device 178. At least some of the second routing structures 176 within the array region 102 may, for example, be configured and employed as redistribution material (RDM) structures (also referred to as "redistribution layer" (RDL) structures) to effectively shift (e.g., stagger, adjust, modify) lateral positions of semiconductor pillars of the access devices 156 to accommodate a desired arrangement (e.g., a hexagonal close packed arrangement) of the storage node devices 178 vertically over and in electrical communication with the access devices 156.

While FIGS. 8A through 8D show the formation of a single (e.g., only one) second routing tier 174 including second routing structures 176, multiple (e.g., more than one) second routing tiers 174 each individually including a desired arrangement (e.g., pattern) of second routing structures 176 may be formed. By of non-limiting example, two or more (e.g., three or more) of the second routing tiers 174 may be formed, wherein different second routing tiers 174 are vertically offset from one another and each individually include a desired arrangement of second routing structures 176 therein. At least some of the second routing structures 176 within at least one of the second routing tiers 174 may be coupled to at least some of the second routing structures 176 within at least one other of the second routing tiers 174 by way of conductive interconnect structures.

Referring to again to FIG. 8A, within the array region 102, the storage node devices 178 may individually be formed and configured to store a charge representative of a programmable logic state of the memory cell 186 including the storage node device 178. In some embodiments, the storage node devices 178 comprise capacitors. During use and operation, a charged capacitor may represent a first logic state, such as a logic 1; and an uncharged capacitor may represent a second logic state, such as a logic 0. Each of the storage node devices 178 may, for example, be formed to include a first electrode (e.g., a bottom electrode), a second electrode (e.g., a top electrode), and a dielectric material between the first electrode and the second electrode.

Figure 8D:
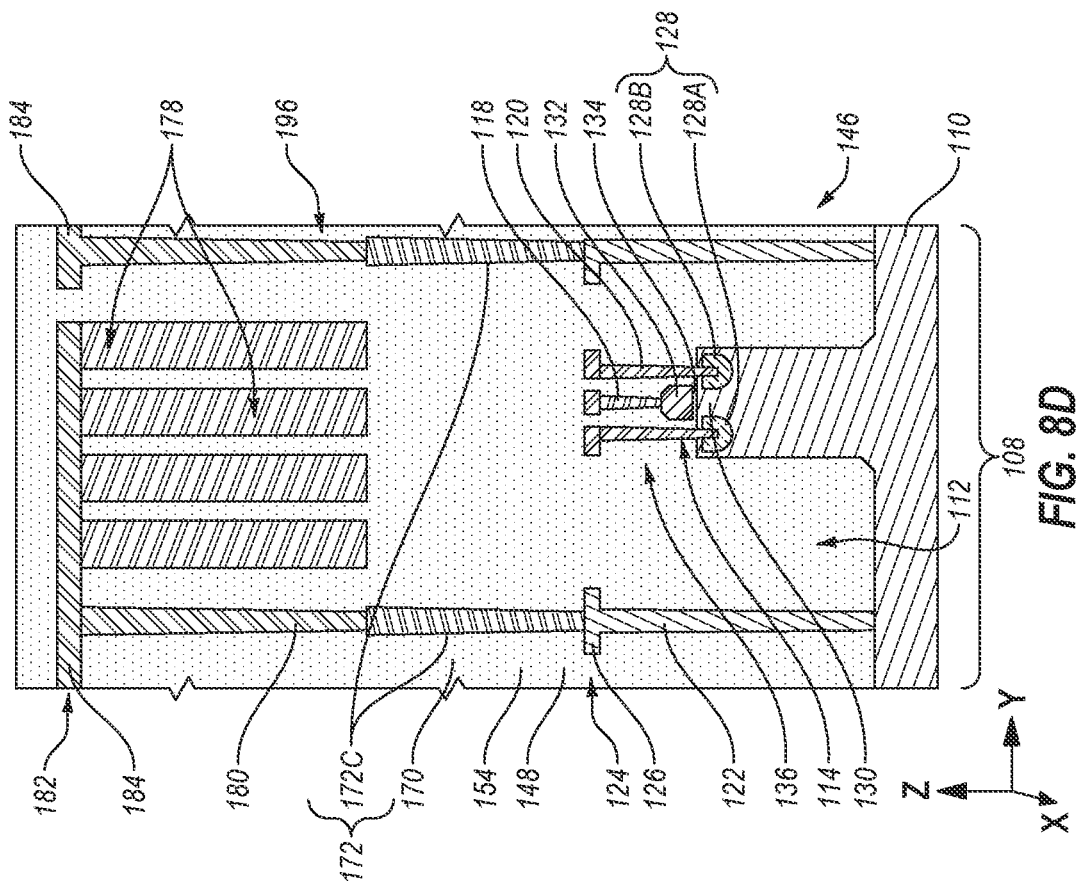
Figure 8C:
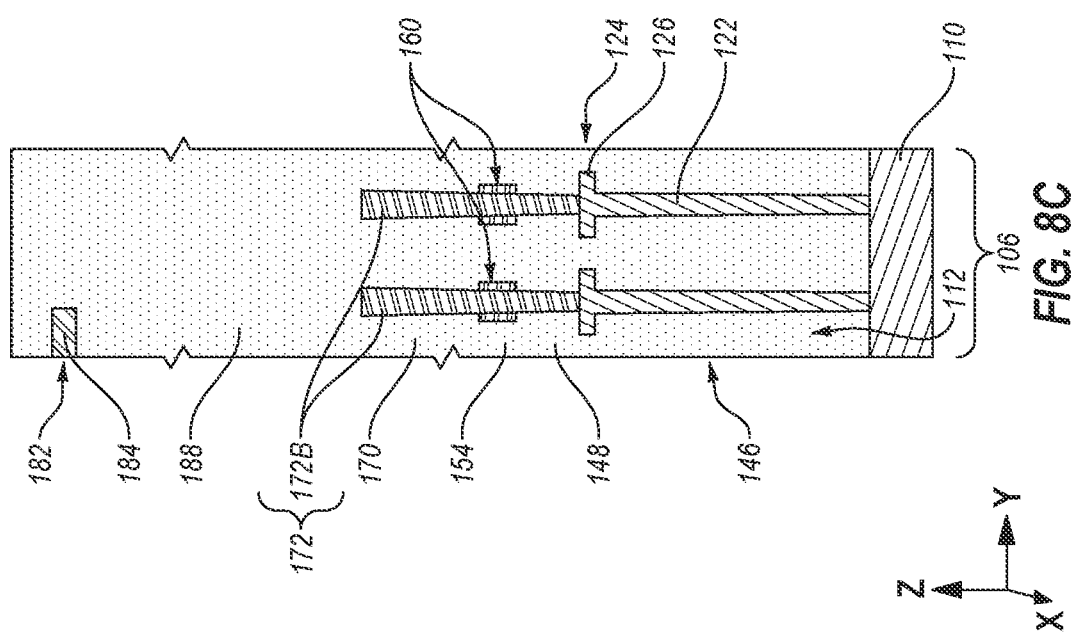
Figure 9B:
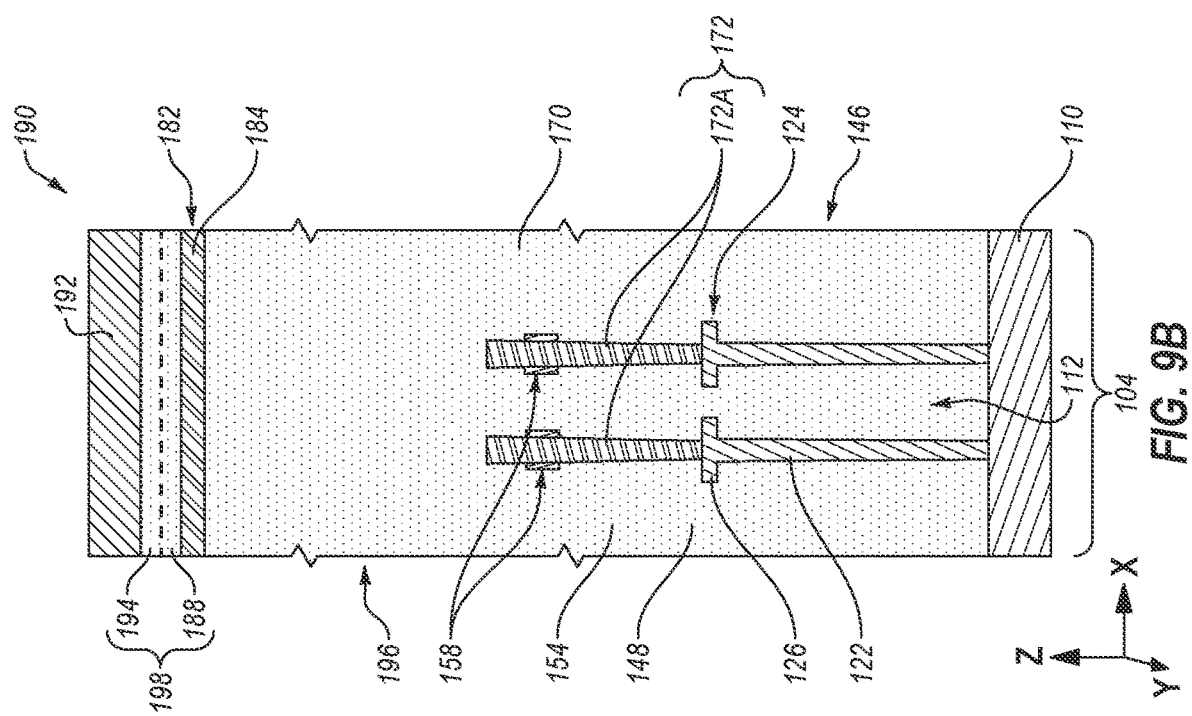
FIGS. 9A through 9D are simplified, partial longitudinal cross-sectional views of the array region (FIG. 9A), the digit line exit region (FIG. 9B), the word line exit region (FIG. 9C), and the socket region (FIG. 9D) shown in FIGS. 2A through 2D, respectively, at another processing stage of the method of forming the microelectronic device following the processing stage of FIGS. 8A through 8D.
Figure 9A:
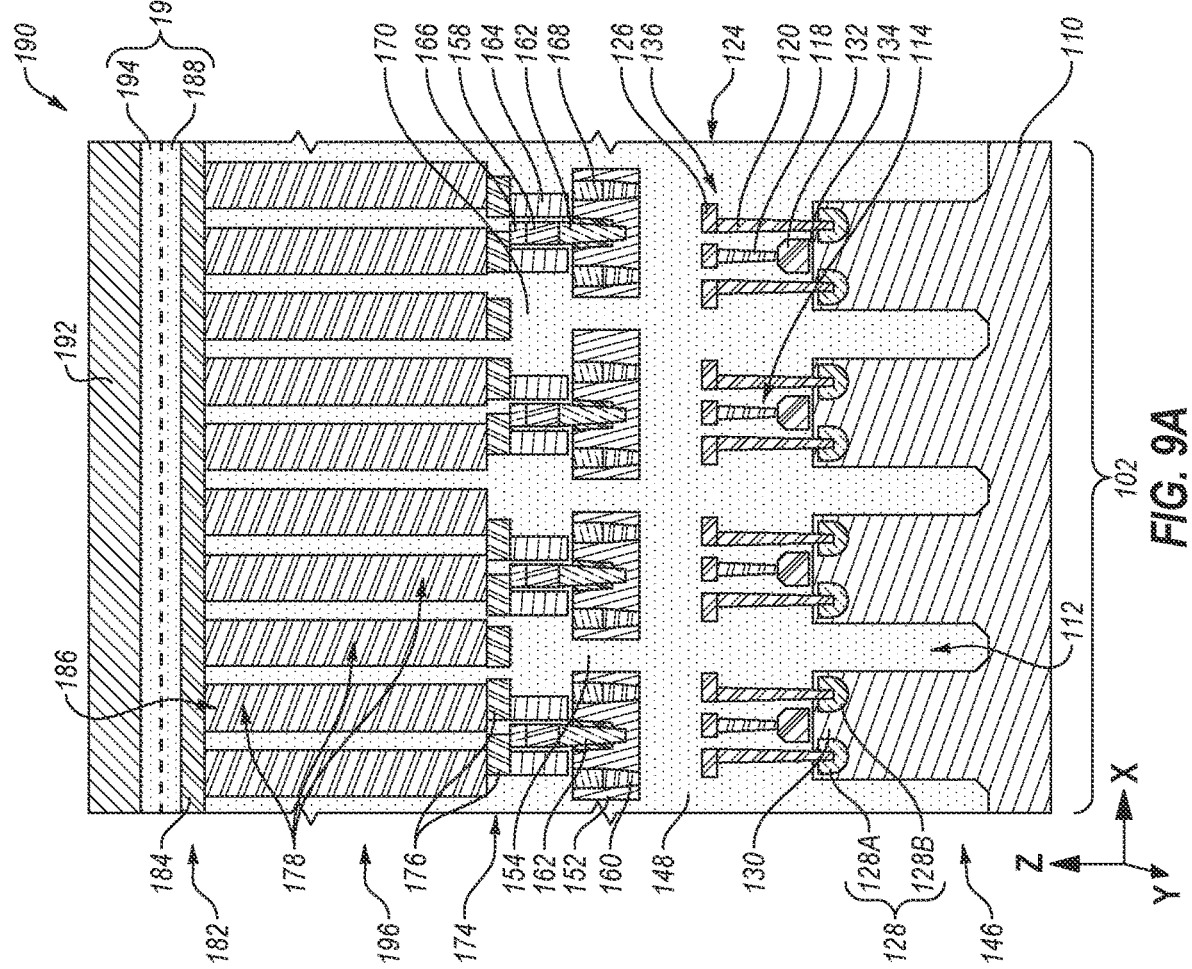
Figure 9D:
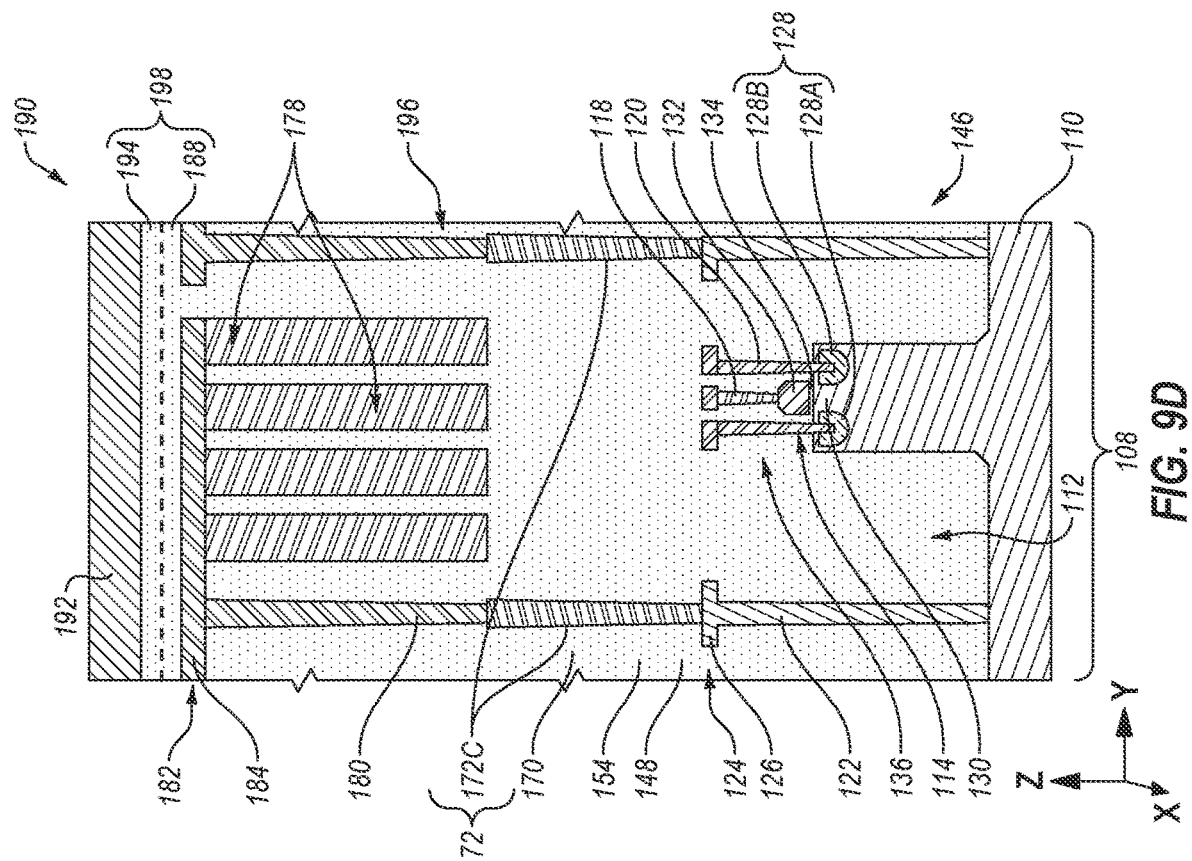
Figure 9C:
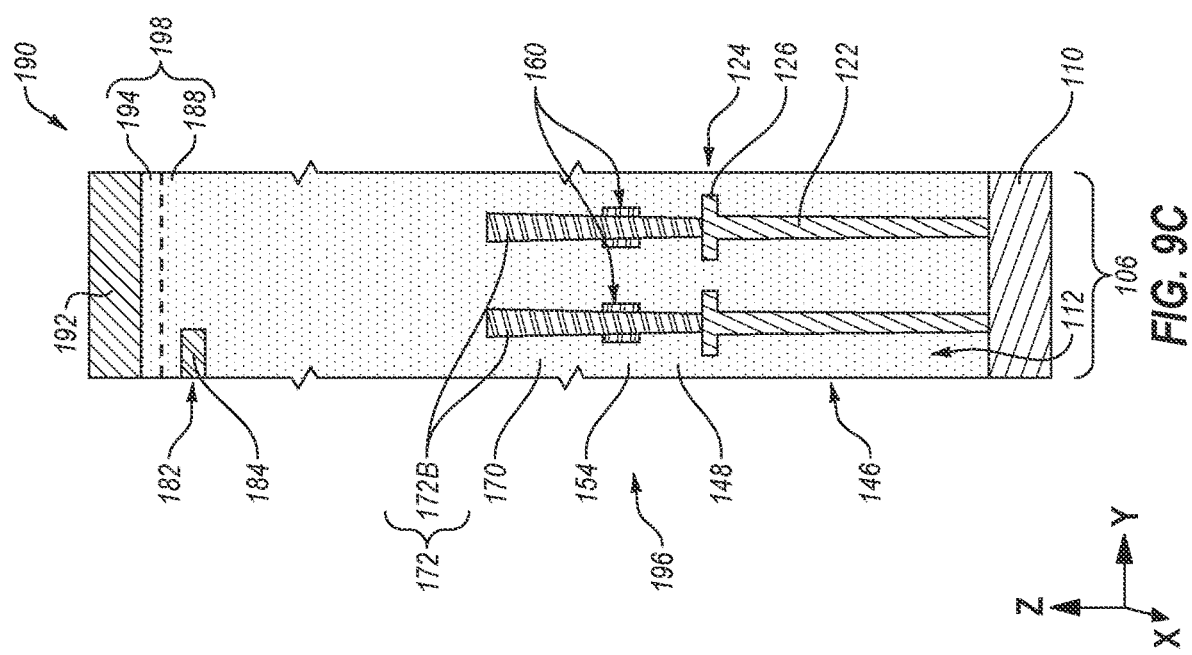

Referring to next to FIG. 8D, within the socket region 108, at least some of the seventh contact structures 180 may be formed to contact at least some of the sixth contact structures 172 within the third group 172C of the sixth contact structures 172. For example, one or more the seventh contact structures 180 may be formed to vertically extend to and terminate on or within one or more of the sixth contact structures 172 located within the socket region 108. The seventh contact structures 180 may individually be formed of and include conductive material. By way of non-limiting example, the seventh contact structures 180 may each individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, each of the seventh contact structures 180 is formed of and includes W. Each of the seventh contact structures 180 may be substantially homogeneous, or one or more of the seventh contact structures 180 may individually be heterogeneous. In some embodiments, each of the seventh contact structures 180 is substantially homogeneous. In additional embodiments, each of the seventh contact structures 180 is heterogeneous. Each seventh contact structure 180 may, for example, be formed of and include a stack of at least two different conductive materials.

As shown in FIG. 8D, within the socket region 108, one or more groups of storage node devices 178 (e.g., capacitors) may, optionally, also be formed. If formed within the socket region 108, the storage node devices 178 may be coupled to at least some of the third routing structures 184 positioned within the socket region 108. If formed, the storage node devices 178 may be employed to enhance the performance of a microelectronic device formed through the methods of the disclosure. The storage node devices 178 may, for example, subsequently (e.g., following completion of additional processing stages of the method of forming the microelectronic device) be coupled to and employed to power additional devices (e.g., control logic devices, access devices) of a microelectronic device of the disclosure. In some embodiments, the storage node devices 178 are subsequently coupled to and employed to power at least some of the control logic devices 136. The storage node devices 178 formed within socket region 108 may be coupled to (e.g., by way of one or more of the third routing structures 184, one or more of the seventh contact structures 180, one or more of the sixth contact structures 172, one or more of the first routing structures 126, and one or more of the third contact structures 122) to BEOL structures to subsequently be formed, as also described in further detail below.

Referring collectively to FIGS. 8A through 8D, the third routing structures 184 of the third routing tier 182 may be employed to facilitate electrical communication between additional features (e.g., structures, materials, devices) coupled thereto. In some embodiments, one or more of the third routing structures 184 are formed to horizontally extend between and couple at least some of the storage node devices 178 (and, hence, the memory cells 186) (FIG. 8A) within the array region 102 (FIG. 8A) to one or more of the seventh contact structures 180 (FIG. 8D) within the socket region 108 (FIG. 8D). The third routing structures 184 may each be formed of and include conductive material. By way of non-limiting example, the third routing structures 184 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, each of the third routing structures 184 of the third routing tier 182 is formed of and includes W.

With continued reference to FIGS. 8A through 8D, a fifth isolation material 188 may be formed on or over portions of at least the fourth isolation material 170, the second routing structures 176 (FIG. 8A), the storage node devices 178 (FIGS. 8A and 8D), the seventh contact structures 180 (FIG. 8D), and the third routing structures 184. The fifth isolation material 188 may be formed of and include at least one insulative material. A material composition of the fifth isolation material 188 may be substantially the same as a material composition of the fourth isolation material 170, or the material composition of the fifth isolation material 188 may be different than the material composition of the fourth isolation material 170. In some embodiments, the fifth isolation material 188 is formed of and includes a dielectric oxide material, such as $SiO_x$ (e.g., $SiO_2$). The fifth isolation material 188 may be substantially homogeneous, or the fifth isolation material 188 may be heterogeneous. In some embodiments, the fifth isolation material 188 is substantially homogeneous. In additional embodiments, the fifth isolation material 188 is heterogeneous. The fifth isolation material 188 may, for example, be formed of and include a stack of at least two different dielectric materials.

Referring next to FIGS. 9A through 9D, illustrated are simplified, partial longitudinal cross-sectional views, from the directional perspectives previously described, of the array region 102 (FIG. 9A), the digit line exit region 104 (FIG. 9B), the word line exit region 106 (FIG. 9C), and the socket region 108 (FIG. 9D) at a processing stage of the method of forming the microelectronic device following the processing stage previously described with reference to FIGS. 8A through 8D. As collectively depicted in FIGS. 9A through 9D, a third microelectronic device structure 190 (e.g., a third wafer) including a base structure 192 and a sixth isolation material 194 may be vertically inverted (e.g., flipped upside down in the Z-direction), and the sixth isolation material 194 thereof may be attached (e.g., bonded, such as through oxide-oxide bonding) to the fifth isolation material 188 to form an additional microelectronic device structure assembly 196. Attaching (e.g., bonding) the sixth isolation material 194 to the fifth isolation material 188 may form a second connected isolation structure 198.

The base structure 192 of the third microelectronic device structure 190 comprises a base material or construction upon which additional features (e.g., materials, structures, devices) of the formed. In some embodiments, the base structure 192 comprises a wafer. The base structure 192 may be formed of and include one or more of semiconductor material (e.g., one or more of a silicon material, such monocrystalline silicon or polycrystalline silicon (also referred to herein as "polysilicon"); silicon-germanium; germanium; gallium arsenide; a gallium nitride; gallium phosphide; indium phosphide; indium gallium nitride; and aluminum gallium nitride), a base semiconductor material on a supporting structure, glass material (e.g., one or more of borosilicate glass (BSP), phosphosilicate glass (PSG), fluorosilicate glass (FSG), borophosphosilicate glass (BPSG), aluminosilicate glass, an alkaline earth boro-aluminosilicate glass, quartz, titania silicate glass, and soda-lime glass), and ceramic material (e.g., one or more of poly-aluminum nitride (p-AlN), silicon on poly-aluminum nitride (SOPAN), aluminum nitride (AlN), aluminum oxide (e.g., sapphire; $\alpha$-$Al_2O_3$), and silicon carbide). By way of non-limiting example, the base structure 192 may comprise a semiconductor wafer (e.g., a silicon wafer), a glass wafer, or a ceramic wafer. The base structure 192 may include one or more layers, structures, and/or regions formed therein and/or thereon.

The sixth isolation material 194 of the third microelectronic device structure 190 may be formed of and include at least one insulative material. A material composition of the sixth isolation material 194 may be substantially the same as a material composition of the fifth isolation material 188; or the material composition of the sixth isolation material 194 may be different than the material composition of the fifth isolation material 188. In some embodiments, the sixth isolation material 194 is formed of and includes a dielectric oxide material, such as $SiO_x$ (e.g., $SiO_2$). The sixth isolation material 194 may be substantially homogeneous, or the sixth isolation material 194 may be heterogeneous. In some embodiments, the sixth isolation material 194 8 is substantially homogeneous. In additional embodiments, the sixth isolation material 194 is heterogeneous. The sixth isolation material 194 may, for example, be formed of and include a stack of at least two different dielectric materials.

To form second connected isolation structure 198 of the additional microelectronic device structure assembly 196, after physically contacting the fifth isolation material 188 with the sixth isolation material 194, the fifth isolation material 188 and the sixth isolation material 194 may be exposed to annealing conditions to form bonds (e.g., oxide-to-oxide bonds) between the fifth isolation material 188 and the sixth isolation material 194. By way of non-limiting example, the fifth isolation material 188 and the sixth isolation material 194 may be exposed to a temperature greater than or equal to about 400° C. (e.g., within a range of from about 400° C. to about 800° C., greater than about 800° C.) to form oxide-to-oxide bonds between the fifth isolation material 188 and the sixth isolation material 194. In some embodiments, the fifth isolation material 188 and the sixth isolation material 194 are exposed to at least one temperature greater than about 800° C. to form oxide-to-oxide bonds between the fifth isolation material 188 and the sixth isolation material 194.

While in FIGS. 9A through 9D, the fifth isolation material 188 and the sixth isolation material 194 of the second connected isolation structure 198 are distinguished from one another by way of a dashed line, the fifth isolation material 188 and the sixth isolation material 194 may be integral and continuous with one another. Put another way, the second connected isolation structure 198 may be a substantially monolithic structure including the fifth isolation material 188 as a first region (e.g., a vertically lower region) thereof, and the sixth isolation material 194 as a second region (e.g., a vertically upper region) thereof. For the second connected isolation structure 198, the sixth isolation material 194 thereof may be attached to the fifth isolation material 188 thereof without a bond line.

Referring next to FIGS. 10A through 10D, illustrated are simplified, partial longitudinal cross-sectional views, from the directional perspectives previously described, of the array region 102 (FIG. 10A), the digit line exit region 104 (FIG. 10B), the word line exit region 106 (FIG. 10C), and the socket region 108 (FIG. 10D) at a processing stage of the method of forming the microelectronic device following the processing stage previously described with reference to FIGS. 9A through 9D. As collectively depicted in FIGS. 10A through 10D, the additional microelectronic device structure assembly 196 may be vertically inverted (e.g., flipped upside down in the Z-direction), and then an upper portion of the first base semiconductor structure 110 (FIGS. 9A through 9D) may be removed to expose (e.g., uncover) the first isolation material 116 within the filled trenches 112 (FIGS. 9A through 9D) and form a second semiconductor tier 200 including second semiconductor structures 202. The second semiconductor structures 202 may be separated from one another by remaining portions of the first isolation material 116.

The upper portion of the first base semiconductor structure 110 (FIGS. 9A through 9D) vertically overlying the filled trenches 112 (FIGS. 9A through 9D) following the vertical inversion of the additional microelectronic device structure assembly 196 may be removed using at least one conventional wafer thinning process (e.g., a conventional chemical-mechanical planarization (CMP) process; a conventional etching process, such as a conventional dry etching process, or a conventional wet etching process). The second semiconductor structures 202 may be formed to exhibit a desired vertical height (e.g., in the Z-direction) through the material removal process. The material removal process may also remove portions (e.g., upper portions following the vertical inversion of the additional microelectronic device structure assembly 196) of the first isolation material 116. As shown in FIG. 10D, within the socket region 108, the material removal process may partially expose the third contact structures 122. The material removal process may also remove portions (e.g., upper portions following the vertical inversion of the additional microelectronic device structure assembly 196) of the third contact structures 122.

Referring next to FIGS. 11A through 11D, illustrated are simplified, partial longitudinal cross-sectional views, from the directional perspectives previously described, of the array region 102 (FIG. 11A), the digit line exit region 104 (FIG. 11B), the word line exit region 106 (FIG. 11C), and the socket region 108 (FIG. 11D) at a processing stage of the method of forming the microelectronic device following the processing stage previously described with reference to FIGS. 10A through 10D. As collectively depicted in FIGS. 11A through 11D, at least one fourth routing tier 204 including fourth routing structures 206 may be formed over the first isolation material 116, the second semiconductor structures 202 (FIG. 11A), the transistors 114 (and, hence, the control logic devices 136), and the third contact structures 122 (FIGS. 11B through 11D); and BEOL structures may be formed over the fourth routing tier 204. The BEOL structures may, for example, be formed to include at least one fifth routing tier 208 including fifth routing structures 210 over the fourth routing tier 204; and at least one sixth routing tier 212 including sixth routing structures 214 over the fifth routing tier 208. One or more of the fourth routing structures 206 of the fourth routing tier 204 may be coupled to one or more of the third contact structures 122 (e.g., within the socket region 108 (FIG. 11D)) by way of one of more eighth contact structures 215 (FIG. 11D). In addition, one or more of the fifth routing structures 210 of the fifth routing tier 208 may be coupled to one or more of the third contact structures 122 (e.g., within the socket region 108 (FIG. 11D)) by way of one or more ninth contact structures 216 (FIG. 11D). Furthermore, one or more of the sixth routing structures 214 (e.g., one or more conductive pad structures) of the sixth routing tier 212 may be coupled to one or more of the fifth routing structures 210 of the fifth routing tier 208 by way of tenth contact structures 218 (FIG. 11D). In further embodiments, at least some (e.g., all) of the tenth contact structures 218 (FIG. 11D) are omitted (e.g., are not formed), and one or more of the sixth routing structures 214 of the sixth routing tier 212 are formed to directly physically contact one or more of the fifth routing structures 210 of the fifth routing tier 208.

The fourth routing structures 206 and the eighth contact structures 215 (FIG. 11D) may each be formed of and include conductive material. By way of non-limiting example, the fourth routing structures 206 and the eighth contact structures 215 (FIG. 11D) may be formed of and include one or more of at least one metal, at least one alloy, and at least one conductive metal-containing material (e.g., a conductive metal nitride, a conductive metal silicide, a conductive metal carbide, a conductive metal oxide). In some embodiments, the fourth routing structures 206 and the eighth contact structures 215 (FIG. 11D) are formed of and include W. At least some of the fourth routing structures 206 may be employed as local routing structures of a microelectronic device (e.g., a memory device, such as a DRAM device).

While FIGS. 11A through 11D show the formation of a single (e.g., only one) fourth routing tier 204 including fourth routing structures 206, multiple (e.g., more than one) fourth routing tiers 204 each individually including a desired arrangement (e.g., pattern) of fourth routing structures 206 may be formed. By of non-limiting example, two or more (e.g., three or more) of the fourth routing tiers 204 may be formed, wherein different fourth routing tiers 204 are vertically offset from one another and each individually include a desired arrangement of fourth routing structures 206 therein. At least some of the fourth routing structures 206 within at least one of the fourth routing tiers 204 may be coupled to at least some of the fourth routing structures 206 within at least one other of the fourth routing tiers 204 by way of conductive interconnect structures.

Still referring collectively to FIGS. 11A through 11D, the fifth routing structures 210, the sixth routing structures 214, the ninth contact structures 216 (FIG. 11D), and the tenth contact structures 218 (FIG. 11D) (if any) may each be formed of and include conductive material. By way of non-limiting example, the fifth routing structures 210, the sixth routing structures 214, the ninth contact structures 216 (FIG. 11D), and the tenth contact structures 218 (FIG. 11D) may individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, the fifth routing structures 210 are each formed of and include Cu; the sixth routing structures 214 are each formed of and include Al; and the ninth contact structures 216 (FIG.

11D) and the tenth contact structures 218 (FIG. 11D) are each formed of and include W.

While FIGS. 12A through 12D show the formation of a single (e.g., only one) fifth routing tier 208 including fifth routing structures 210, multiple (e.g., more than one) fifth routing tiers 208 each individually including a desired arrangement (e.g., pattern) of fifth routing structures 210 may be formed. In addition, while FIGS. 11A through 11D show the formation of a single (e.g., only one) sixth routing tier 212 including sixth routing structures 214, multiple (e.g., more than one) sixth routing tiers 212 each individually including a desired arrangement (e.g., pattern) of sixth routing structures 214 may be formed. By of non-limiting example, two or more (e.g., three or more) of the fifth routing tier 208 may be formed, wherein different fifth routing tier 208 are vertically offset from one another and each individually include a desired arrangement of fifth routing structures 210 therein. At least some of the fifth routing structures 210 within at least one of the fifth routing tiers 208 may be coupled to at least some of the fifth routing structures 210 within at least one other of the fifth routing tiers 208 by way of conductive interconnect structures.

Referring to FIG. 11D, in some embodiments, at least some of the fifth routing structures 210 and the sixth routing structures 214 are formed to be in electrical communication with at least some of the third routing structures 184 coupled to the memory cells 186 (FIG. 11A) within the array region 102 (FIG. 11A) by way of at least one deep contact assembly extending between the at least some of the fifth routing structures 210 and at least some of the third routing structures 184 within the socket region 108. As shown in FIG. 11D, the deep contact assembly may include some of the contact structures (e.g., at least one of the tenth contact structures 218 (if any), at least one of the ninth contact structures 216, at least one of the third contact structures 122, at least one of the sixth contact structures 172, and at least one of the seventh contact structures 180) located within the socket region 108, as well the routing structures within the socket region 108 coupled to the some of the contact structures.

Still referring to collectively to FIGS. 11A through 11D, a seventh isolation material 220 may be formed on or over portions of at least the fourth routing structures 206, the fifth routing structures 210, the sixth routing structures 214, the eighth contact structures 215 (FIG. 11D), the ninth contact structures 216 (FIG. 11D), and the tenth contact structures 218 (FIG. 11D) (if any). The seventh isolation material 220 may be formed of and include at least one insulative material. A material composition of the seventh isolation material 220 may be substantially the same as a material composition of the first isolation material 116, or the material composition of the seventh isolation material 220 may be different than the material composition of the first isolation material 116. In some embodiments, the seventh isolation material 220 is formed of and includes a dielectric oxide material, such as $SiO_x$ (e.g., $SiO_2$). The seventh isolation material 220 may be substantially homogeneous, or the seventh isolation material 220 may be heterogeneous. In some embodiments, the seventh isolation material 220 is substantially homogeneous. In additional embodiments, the seventh isolation material 220 is heterogeneous. The seventh isolation material 220 may, for example, be formed of and include a stack of at least two different dielectric materials. In addition, as shown in FIG. 11D, one or more openings 222 may be formed within the seventh isolation material 220 (e.g., within a portion of the seventh isolation material 220 within the socket region 108 (FIG. 11D)) to expose (and, hence, facilitate access to) one or more portions of one or more of the sixth routing structures 214 (e.g., one or more conductive pad structures) of the sixth routing tier 212.

As shown in FIGS. 11A through 11D, the method described above with reference to FIGS. 1 through 11D may effectuate the formation of a microelectronic device 224 (e.g., a memory device, such as a DRAM device) including the features (e.g., structures, materials, devices) previously described herein. In some embodiments, at least some of the fifth routing structures 210 and the sixth routing structures 214 are employed as global routing structures for the microelectronic device 224. The fifth routing structures 210 and the sixth routing structures 214 may, for example, be configured to receive global signals from an external bus, and to relay the global signals to other features (e.g., structures, devices) of the microelectronic device 224.

Thus, in accordance with embodiments of the disclosure, a method of forming a microelectronic device comprises forming a first microelectronic device structure comprising a first semiconductor structure, control logic circuitry including transistors at least partially overlying the first semiconductor structure, and a first isolation material covering the first semiconductor structure and the control logic circuitry. A second microelectronic device structure comprising a second semiconductor structure and a second isolation material over the second semiconductor structure is formed. The second isolation material of the second microelectronic device structure is bonded to the first isolation material of the first microelectronic device structure to attach the second microelectronic device structure to the first microelectronic device structure. Memory cells comprising portions of the second semiconductor structure are formed after attaching the second microelectronic device structure to the first microelectronic device structure.

Furthermore, in accordance with additional embodiments of the disclosure, a method of forming a microelectronic device comprises forming a first wafer comprising a semiconductor material, control logic devices including comprising portions of the semiconductor material, and oxide dielectric material covering the semiconductor material and the control logic devices. A second wafer comprising additional semiconductor material and additional oxide dielectric material over the additional semiconductor material is formed. The second wafer is attached to the semiconductor wafer to using oxide-oxide bonding between the additional oxide dielectric material and the oxide dielectric material. Access devices are formed using portions of the additional semiconductor material. Word lines and digit lines operatively associated with the access devices are formed. Contact structures are formed to penetrate the word lines and the digit lines, the contact structures formed to be in electrical communication with the control logic devices. Capacitors are formed over and in electrical communication with the access devices to form memory cells. Routing structures are formed over the capacitors, the routing structures formed to be in electrical communication with the memory cells and the control logic devices.

Figure 12:
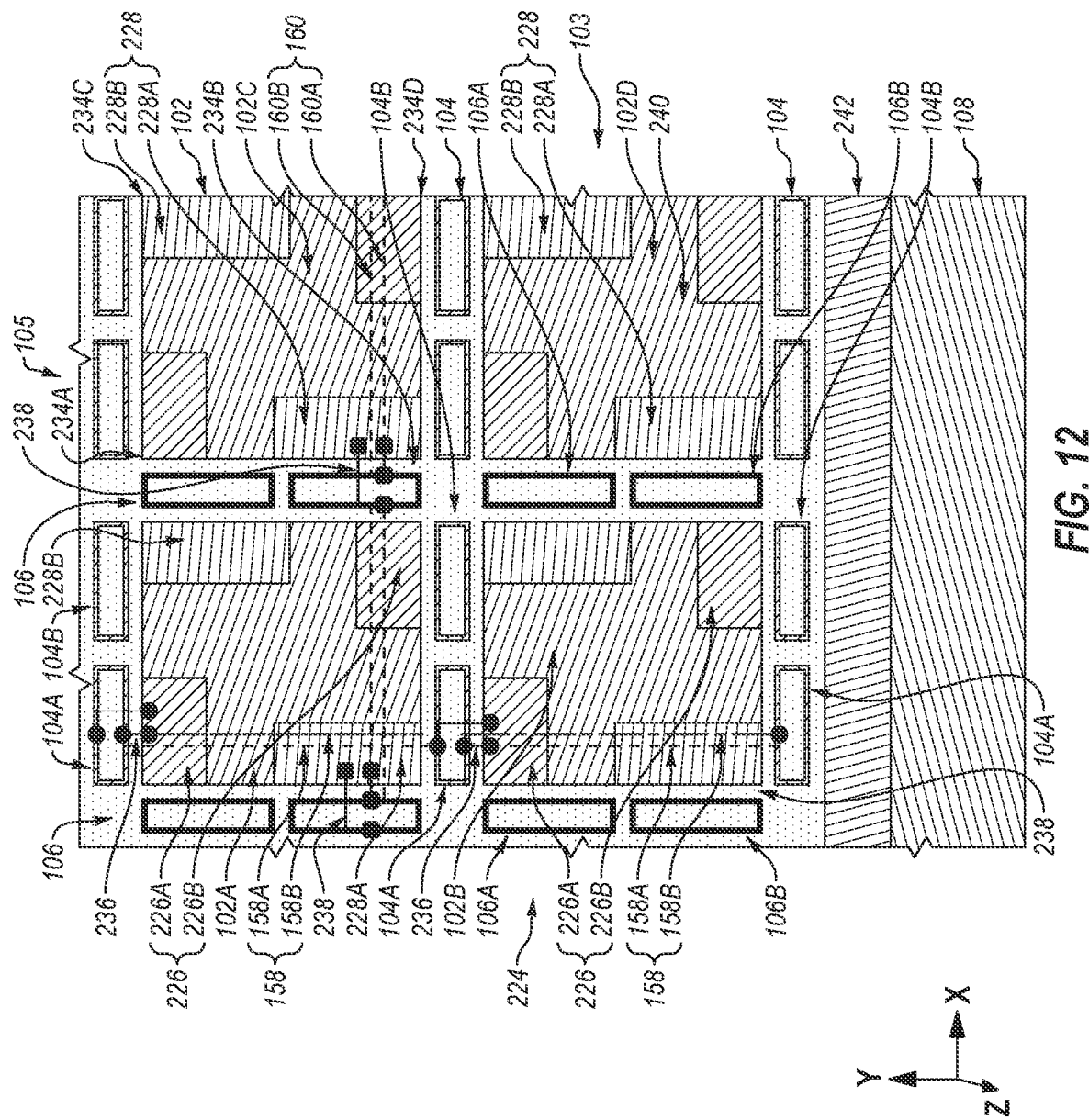
FIG. 12 is a simplified plan view of a microelectronic device, in accordance with an embodiment of the disclosure.

Referring next to FIG. 12, depicted is a simplified plan view of the microelectronic device 224 illustrating an arrangement of different control logic sections (described in further detail below) within individual different regions (e.g., the array regions 102, such as the first array region 102A, the second array region 102B, the third array region 102C, and the fourth array region 102D; the socket regions 108) of the microelectronic device 224, as well as routing arrangements to different control logic devices (e.g., corresponding to the control logic devices 207 (FIG. 11A)) within the different control logic sections, in accordance with embodiments of the disclosure. The different control logic devices of the different control logic sections may be positioned vertically above (e.g., in the Z-direction) the memory cells 186 (FIG. 11A) of the microelectronic device 224. At least some of the different control logic devices may be coupled to the memory cells 186 (FIG. 11A) in the manner previously described with reference to FIGS. 11A through 11D. For clarity and ease of understanding the description, not all features (e.g., structures, materials, devices) of the microelectronic device 224 previously described with reference to FIGS. 11A through 11D are illustrated in FIG. 12.

As shown in FIG. 12, within a horizontal area of each array region 102, the microelectronic device 224 may be formed to include a desired arrangement of sense amplifier (SA) sections 226 and sub-word line driver (SWD) sections 228. The SA sections 226 may include SA devices coupled to the digit lines 158 of the microelectronic device 224, as described in further detail below. The digit lines 158 may vertically underlie (e.g., in the Z-direction) the SA devices of the SA sections 226 within the microelectronic device 224. The SWD sections 228 may include SWD devices coupled to the word lines 160 of the microelectronic device 224, as also described in further detail below. The word lines 160 may vertically underlie (e.g., in the Z-direction) the SWD devices of the SWD sections 228 within the microelectronic device 224.

The SA sections 226 within a horizontal area an individual array region 102 (e.g., the first array region 102A, the second array region 102B, the third array region 102C, or the fourth array region 102D) may include a first SA section 226A and a second SA section 226B. For an individual array region 102, the first SA section 226A and the second SA section 226B may be positioned at or proximate opposite corners (e.g., diagonally opposite corners) of the array region 102 than one another. For example, as shown in FIG. 12, for an individual array region 102, the first SA section 226A may be positioned at or proximate a first corner 234A of the array region 102, and the second SA section 226B may be positioned at or proximate a second corner 234B of the array region 102 located diagonally opposite (e.g., kitty-corner) the first corner 234A.

For each SA section 226 (e.g., the first SA section 226A, the second SA section 226B) within an individual array region 102, the SA devices of the SA section 226 may be coupled to a group of the digit lines 158 horizontally extending (e.g., in the Y-direction) through the array region 102 by way of digit line routing and contact structures 236. The digit line routing and contact structures 236 may, for example, correspond to some of the routing structures (e.g., some of the first routing structures 126 (FIGS. 11A and 11B); some of the fourth routing structures 206 (FIGS. 11A and 11B)) and some of the contact structures (e.g., some of the first group 172A (FIG. 11B) of the sixth contact structures 172 (FIG. 11B); some of the third contact structures 122 (FIG. 11B); some of the eighth contact structures 215 (FIG. 11D)) previously described herein.

The SA devices of the SA sections 226 of array regions 102 horizontally neighboring one another in the Y-direction (e.g., the first array region 102A and the second array region 102B; the third array region 102C and the fourth array region 102D) may be coupled to different groups of digit lines 158 than one another. For example, each of the SA sections 226 (e.g., each of the first SA section 226A and the second SA section 226B) of the first array region 102A may include so-called "even" SA devices coupled to even digit lines 158B of the microelectronic device 224 by way of the digit line routing and contact structures 236 associated with the SA sections 226; and each of the SA sections 226 (e.g., each of the first SA section 226A and the second SA section 226B) of the second array region 102B may include so-called "odd" SA devices coupled to odd digit lines 158A of the microelectronic device 224 by way of the digit line routing and contact structures 236 associated with the SA sections 226; or vice versa. The even digit lines 158B of the microelectronic device 224 may horizontally alternate with the odd digit lines 158A of the microelectronic device 224 in the X-direction. The SA devices of each of the SA sections 226 of the first array region 102A may not be coupled to any odd digit lines 158A; and the SA devices of each of the SA sections 226 of the second array region 102B may not be coupled to any even digit lines 158B; or vice versa. Similarly, each of the SA sections 226 (e.g., each of the first SA section 226A and the second SA section 226B) of the third array region 102C horizontally neighboring the first array region 102A in the X-direction may include additional even SA devices coupled to additional even digit lines 158B of the microelectronic device 224 by way of the digit line routing and contact structures 236 associated with the SA sections 226; and each of the SA sections 226 (e.g., each of the first SA section 226A and the second SA section 226B) of the fourth array region 102D horizontally neighboring the second array region 102B in the X-direction may include additional odd SA devices coupled to additional odd digit lines 158A of the microelectronic device 224 by way of the digit line routing and contact structures 236 associated with the SA sections 226; or vice versa.

As shown in FIG. 12, the SA devices (e.g., odd SA devices or even SA devices) within an individual SA section 226 of an individual array region 102 may be coupled to digit lines (e.g., odd digit lines 158A or even digit lines 158B) horizontally extending through the array region 102, and may also be coupled to additional digit lines (e.g., additional odd digit lines 158A or additional even digit lines 158B) horizontally extending through another array region 102 horizontally neighboring the array region 102 in the Y-direction. For example, some odd SA devices within the first SA section 226A of the second array region 102B may be coupled to odd digit lines 158A horizontally extending through the second array region 102B by way of some digit line routing and contact structures 236 extending to and through the first digit line exit subregion 104A horizontally neighboring the second array region 102B in the Y-direction; and some additional odd SA devices within the first SA section 226A of the second array region 102B may be coupled to additional odd digit lines 158A horizontally extending through the first array region 102A by way of some additional digit line routing and contact structures 236 extending to and through the first digit line exit subregion 104A. As another example, some even SA devices within the second SA section 226B of the first array region 102A may be coupled to even digit lines 158B horizontally extending through the first array region 102A by way of some digit line routing and contact structures 236 extending to and through the second digit line exit subregion 104B horizontally neighboring the first array region 102A in the Y-direction; and some additional even SA devices within the second SA section 226B of the first array region 102A may be coupled to additional even digit lines 158B horizontally extending through the second array region 102B by way of some additional digit line routing and contact structures 236 extending to and through the second digit line exit subregion 104B.

With maintained reference to FIG. 12, the SWD sections 228 within a horizontal area an individual array region 102 (e.g., the first array region 102A, the second array region 102B, the third array region 102C, or the fourth array region 102D) may include a first SWD section 228A and a second SWD section 228B. For an individual array region 102, the first SWD section 228A and the second SWD section 228B may be positioned at or proximate different corners than the first SA section 226A and a second SA section 226B. In addition, the corner of the array region 102 associated with first SWD section 228A may oppose (e.g., diagonally oppose) the corner of the array region 102 associated with second SWD section 228B. For example, as shown in FIG. 12, for an individual array region 102, the first SWD section 228A may be positioned at or proximate a third corner 234C of the array region 102, and the second SWD section 228B may be positioned at or proximate a fourth corner 234D of the array region 102 located diagonally opposite (e.g., kitty-corner) the third corner 234C.

For each SWD section 228 (e.g., the first SWD section 228A, the second SWD section 228B) within an individual array region 102, the SWD devices of the SWD section 228 may be coupled to a group of the word lines 160 horizontally extending (e.g., in the X-direction) the array region 102 by way of word line routing and contact structures 238. The word line routing and contact structures 238 may, for example, correspond to some of the routing structures (e.g., some of the first routing structures 126 (FIGS. 11A and 11B); some of the fourth routing structures 206 (FIGS. 11A and 11B)) and some of the contact structures (e.g., some of the second group 172B (FIG. 11C) of the sixth contact structures 172 (FIG. 11C); some of the third contact structures 122 (FIG. 11C); some of the eighth contact structures 215 (FIG. 11D)) previously described herein.

The SWD devices of the SWD sections 228 of array regions 102 horizontally neighboring one another in the X-direction (e.g., the first array region 102A and the third array region 102C; the second array region 102B and the fourth array region 102D) may be coupled to different groups of word lines 160 than one another. For example, each of the SWD sections 228 (e.g., each of the first SWD section 228A and the second SWD section 228B) of the first array region 102A may include so-called "even" SWD devices coupled to even word lines 160B of the microelectronic device 224 by way of the word line routing and contact structures 238 associated with the SWD sections 228; and each of the SWD sections 228 (e.g., each of the first SWD section 228A and the second SWD section 228B) of the third array region 102C may include so-called "odd" SWD devices coupled to odd word lines 160A of the microelectronic device 224 by way of the word line routing and contact structures 238 associated with the SWD sections 228; or vice versa. The even word lines 160B of the microelectronic device 224 may horizontally alternate with the odd word lines 160A of the microelectronic device 224 in the Y-direction. The SWD devices of each of the SWD sections 228 of the first array region 102A may not be coupled to any odd word lines 160A; and the SWD devices of each of the SWD sections 228 of the third array region 102C may not be coupled to any even word lines 160B; or vice versa. Similarly, each of the SWD sections 228 (e.g., each of the first SWD section 228A and the second SWD section 228B) of the second array region 102B horizontally neighboring the first array region 102A in the Y-direction may include additional even SWD devices coupled to additional even word lines 160B of the microelectronic device 224 by way of the word line routing and contact structures 238 associated with the SWD sections 228; and each of the SWD sections 228 (e.g., each of the first SWD section 228A and the second SWD section 228B) of the fourth array region 102D horizontally neighboring the third array region 102C in the Y-direction may include additional odd SWD devices coupled to additional odd word lines 160A of the microelectronic device 224 by way of the word line routing and contact structures 238 associated with the SWD sections 228; or vice versa.

As shown in FIG. 12, the SWD devices (e.g., odd SWD devices or even SWD devices) within an individual SWD section 228 of an individual array region 102 may be coupled to word lines (e.g., odd word lines 160A or even word lines 160B) horizontally extending through the array region 102, and may also be coupled to additional word lines (e.g., additional odd word lines 160A or additional even word lines 160B) horizontally extending through another array region 102 horizontally neighboring the array region 102 in the X-direction. For example, some odd SWD devices within the first SWD section 228A of the third array region 102C may be coupled to odd word lines 160A horizontally extending through the third array region 102C by way of some word line routing and contact structures 238 extending to and through the second word line exit subregion 106B horizontally neighboring the third array region 102C in the X-direction; and some additional odd SWD devices within the first SWD section 228A of the third array region 102C may be coupled to additional odd word lines 160A horizontally extending through the first array region 102A by way of some additional word line routing and contact structures 238 extending to and through the second word line exit subregion 106B. As another example, some even SWD devices within the second SWD section 228B of the first array region 102A may be coupled to even word lines 160B horizontally extending through the first array region 102A by way of some word line routing and contact structures 238 extending to and through the first word line exit subregion 106A horizontally neighboring the first array region 102A in the X-direction; and some additional even SWD devices within the second SWD section 228B of the first array region 102A may be coupled to additional even word lines 160B horizontally extending through the third array region 102C by way of some additional word line routing and contact structures 238 extending to and through the first word line exit subregion 106A.

With maintained reference to FIG. 12, within a horizontal area of each array region 102, the microelectronic device 224 may include additional control logic sections individually including additional control logic devices (e.g., control logic devices other than SA devices and SWD devices). For example, for each array region 102, additional control logic sections 240 may be positioned horizontally between (e.g., at relatively more horizontally central positions within the array region 102) the SA sections 226 and the SWD sections 228. The additional control logic sections 240 may include, but are not limited to, column decoder device sections including column decoder device, and main word line (MWD) sections including MWD devices.

Still referring to FIG. 12, within a horizontal area of each socket region 108, the microelectronic device 224 may include further control logic sections 242 individually including further control logic devices (e.g., control logic devices in addition to those located within the horizontal areas of the array regions 102). For example, for each socket region 108, one or more further control logic sections 242 may be positioned horizontally between deep contact structures assemblies (e.g., vertically extending from one or more of the fifth routing structures 210 (FIG. 11D) to one or more of the third routing structures 184 (FIG. 11D)) within the socket region 108 and the array regions 102 horizontally neighboring the socket region 108. At least some of the further control logic devices within the further control logic sections 242 may have different configurations and different operational functions than the control logic devices located within the horizontal areas of the array regions 102. By way of non-limiting example, the further control logic sections 242 may include bank logic sections including bank logic devices.

Thus, in accordance with embodiments of the disclosure, a microelectronic device comprises array regions, digit line exit regions, and word line exit regions. The array regions individually comprise memory cells, digit lines, word lines, and control logic devices. The memory cells comprise capacitors, and access devices vertically overlying and in electrical communication with the capacitors. The digit lines are operably associated with the memory cells and horizontally extend in a first direction. The word lines are operably associated with the memory cells and horizontally extend in a second direction orthogonal to the first direction. The control logic devices vertically overlie and are in electrical communication with the memory cells. The control logic devices comprise transistors including gate electrodes vertically underlying channels. The digit line exit regions horizontally alternate with rows of the array regions in the first direction. The digit line exit regions individually comprise portions of the digit lines horizontally extending beyond boundaries of the rows of the array regions horizontally adjacent thereto, digit line contact structures physically contacting and vertically extending completely through at least some of the portions of the digit lines, and routing structures coupled to the digit line contact structures. The word line exit regions horizontally alternate with columns of the array regions in the second direction. The word line exit regions individually comprise portions of the word lines horizontally extending beyond boundaries of the columns of the array regions horizontally adjacent thereto, word line contact structures physically contacting and vertically extending completely through at least some of the portions of the word lines, and additional routing structures coupled to the word line contact structures.

Microelectronic devices (e.g., the microelectronic device 224 (FIGS. 11A through 11D)) in accordance with embodiments of the disclosure may be used in embodiments of electronic systems of the disclosure. For example, FIG. 13 is a block diagram illustrating an electronic system 300 according to embodiments of disclosure. The electronic system 300 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 300 includes at least one memory device 302. The memory device 302 may comprise, for example, a microelectronic device (e.g., the microelectronic device 224 (FIGS. 11A through 11D)) previously described herein. The electronic system 300 may further include at least one electronic signal processor device 304 (often referred to as a "microprocessor"). The electronic signal processor device 304 may, optionally, comprise a microelectronic device (e.g., the microelectronic device 224 (FIGS. 11A through 11D)) previously described herein. While the memory device 302 and the electronic signal processor device 304 are depicted as two (2) separate devices in FIG. 13, in additional embodiments, a single (e.g., only one) memory/processor device having the functionalities of the memory device 302 and the electronic signal processor device 304 is included in the electronic system 300. In such embodiments, the memory/processor device may include a microelectronic device (e.g., the microelectronic device 224 (FIGS. 11A through 11D)) previously described herein. The electronic system 300 may further include one or more input devices 306 for inputting information into the electronic system 300 by a user, such as, for example, a mouse or other pointing device, a keyboard, a touchpad, a button, or a control panel. The electronic system 300 may further include one or more output devices 308 for outputting information (e.g., visual or audio output) to a user such as, for example, a monitor, a display, a printer, an audio output jack, a speaker, etc. In some embodiments, the input device 306 and the output device 308 comprise a single touchscreen device that can be used both to input information to the electronic system 300 and to output visual information to a user. The input device 306 and the output device 308 may communicate electrically with one or more of the memory device 302 and the electronic signal processor device 304.

Thus, in accordance with embodiments of the disclosure, an electronic system comprises an input device, an output device, a processor device operably connected to the input device and the output device, and a memory device operably connected to the processor device. The memory device comprises memory array regions, a digit line contact region horizontally interposed between two of the memory array regions horizontally neighboring one another in a first direction, and a word line contact region horizontally interposed between two other of the memory array regions horizontally neighboring one another in a second direction perpendicular to the first direction. The memory array regions each comprise dynamic random access memory (DRAM) cells, digit lines coupled to the DRAM cells, word lines coupled to the DRAM cells, and control logic circuitry overlying and in electrical communication with the DRAM cells. The control logic circuitry comprises transistors including gate structures vertically underlying channel structures. The digit line contact region comprises end portions of some of the digit lines extending past horizontal boundaries of the two of the memory array regions, digit line contacts coupled to and extending completely through the end portions of the some of the digit lines, and routing structures coupled to the digit line contacts. The word line contact region comprises end portions of some of the word lines extending past horizontal boundaries of the two other of the memory array regions, word line contacts coupled to and extending completely through the end portions of the some of the word lines, and additional routing structures coupled to the word line contacts.

The structures, devices, and methods of the disclosure advantageously facilitate one or more of improved microelectronic device performance, reduced costs (e.g., manufacturing costs, material costs), increased miniaturization of components, and greater packaging density as compared to conventional structures, conventional devices, and conventional methods. The structures, devices, and methods of the disclosure may also improve scalability, efficiency, and simplicity as compared to conventional structures, conventional devices, and conventional methods.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalent. For example, elements and features disclosed in relation to one embodiment may be combined with elements and features disclosed in relation to other embodiments of the disclosure.

What is claimed is:

1. A microelectronic device, comprising:
 array regions individually comprising:
  memory cells comprising capacitors and access devices vertically overlying and in electrical communication with the capacitors;
  digit lines operably associated with the memory cells and horizontally extending in a first direction;
  word lines operably associated with the memory cells and horizontally extending in a second direction perpendicular to the first direction; and
  CMOS circuitry vertically overlying and in electrical communication with the memory cells, the CMOS circuitry comprising:
   transistors including gate electrodes vertically underlying channels; and
   routing structures coupled to the transistors and vertically interposed between the transistors and the memory cells;
 digit line exit regions horizontally alternating with rows of the array regions in the first direction and individually comprising:
  portions of the digit lines horizontally extending beyond boundaries of the rows of the array regions horizontally adjacent thereto; and
  digit line contact structures physically contacting and vertically extending completely through at least some of the portions of the digit lines, the digit line contact structures coupled to some of the routing structures;
 word line exit regions horizontally alternating with columns of the array regions in the second direction and individually comprising:
  portions of the word lines horizontally extending beyond boundaries of the columns of the array regions horizontally adjacent thereto; and
  word line contact structures physically contacting and vertically extending completely through at least some of the portions of the word lines, the word line contact structures coupled to some other of the routing structures.

2. The microelectronic device of claim 1, further comprising socket regions horizontally offset from the array regions, the digit line exit regions, and the word line exit regions, the socket regions individually comprising additional CMOS circuitry vertically overlying the memory cells of the array regions and having different configurations and operational functions than the CMOS circuitry.

3. The microelectronic device of claim 1, wherein the CMOS circuitry within each array region of the array regions comprise:
 sense amplifier circuits within two sense amplifier regions positioned proximate corners of the array region diagonally opposing one another; and
 sub-word line driver circuits within two sub-word line driver regions positioned proximate additional corners of the array region diagonally opposing one another.

4. The microelectronic device of claim 3, wherein, for each sense amplifier region of the two sense amplifier regions within the array region:
 some of the sense amplifier circuits within the sense amplifier region are coupled to some of the digit lines horizontally extending through the array region; and
 some other of the sense amplifier circuits within the sense amplifier region are coupled to some of the digit lines horizontally extending through an additional one of the array regions horizontally neighboring the array region.

5. The microelectronic device of claim 4, wherein:
 the some of the sense amplifier circuits are coupled to the some of the digit lines horizontally extending through the array region by way of some of the digit line contact structures and a group of the some of the routing structures within one of the digit line exit regions horizontally interposed between the array region and the additional one of the array regions; and
 the some other of the sense amplifier circuits are coupled to the some of the digit lines horizontally extending through the additional one of the array regions by way of some other of the digit line contact structures and an additional group of the some of the routing structures within the one of the digit line exit regions.

6. The microelectronic device of claim 3, wherein, for each sub-word line driver region of the two sub-word line driver regions within the array region:
 some of the sub-word line driver circuits within the sub-word line driver region are coupled to some of the word lines horizontally extending through the array region; and
 some other of the sub-word line driver circuits within the sub-word line driver region are coupled to some of the word lines horizontally extending through an additional one of the array regions horizontally neighboring the array region.

7. The microelectronic device of claim 6, wherein:
 the some of the sub-word line driver circuits is coupled to the some of the word lines horizontally extending through the array region by way of some of the word line contact structures and a group of the some other of the routing structures within one of the word line exit regions horizontally interposed between the array region and the additional one of the array regions; and
 the some other of the sub-word line driver circuits is coupled to the some of the word lines horizontally extending through the additional one of the array regions by way of some other of the word line contact structures and an additional group of the some other of the routing structures within the one of the word line exit regions.

8. The microelectronic device of claim 1, further comprising:
 further routing structures vertically overlying the CMOS circuitry and in electrical communication with the memory cells of the array regions; and
 conductive pad structures vertically overlying and in electrical communication with the further routing structures.

9. An electronic system, comprising:
 an input device;
 an output device;
 a processor device operably connected to the input device and the output device; and
 a memory device operably connected to the processor device and comprising:
  memory array regions each comprising:
   dynamic random access memory (DRAM) cells;
   digit lines coupled to the DRAM cells;
   word lines coupled to the DRAM cells; and CMOS circuitry overlying and in electrical communication with the DRAM cells, the CMOS circuitry comprising:
- transistors including gate structures vertically underlying channel structures; and
- routing structures coupled to the transistors and vertically interposed between the transistors and the DRAM cells;

a digit line contact region horizontally interposed between two of the memory array regions horizontally neighboring one another in a first direction, the digit line contact region comprising:
- end portions of some of the digit lines extending past horizontal boundaries of the two of the memory array regions; and
- digit line contacts coupled to and extending completely through the end portions of the some of the digit lines, the digit line contacts coupled to some of the routing structures;

a word line contact region horizontally interposed between two other of the memory array regions horizontally neighboring one another in a second direction perpendicular to the first direction, the word line contact region comprising:
- end portions of some of the word lines extending past horizontal boundaries of the two other of the memory array regions; and
- word line contacts coupled to and extending completely through the end portions of the some of the word lines, the word line contacts coupled to some other of the routing structures.

\* \* \* \* \*

UNITED STATES PATENT AND TRADEMARK OFFICE
CERTIFICATE OF CORRECTION

PATENT NO. : 11,996,377 B2  
APPLICATION NO. : 17/364335  
DATED : May 28, 2024  
INVENTOR(S) : Fatma Arzum Simsek-Ege, Kunal R. Parekh and Beau D. Barry Page 1 of 1

It is certified that error appears in the above-identified patent and that said Letters Patent is hereby corrected as shown below:

In the Specification

| | | |
|---|---|---|
| Column 2, | Line 10, | change "a memory, array of" to --a memory array of-- |
| Column 6, | Line 30, | change "$SiN_y$, $SiO_xC_y$," to --$SiN_y$, $SiO_xN_y$, $SiO_xC_y$,-- |
| Column 17, | Line 11, | change "depth Di (e.g., in" to --depth $D_1$ (e.g., in-- |
| Column 17, | Line 22, | change "depth Di of the" to --depth $D_1$ of the-- |

Signed and Sealed this  
Twenty-third Day of July, 2024

Katherine Kelly Vidal  
*Director of the United States Patent and Trademark Office*